United States Patent
Inoue

(10) Patent No.: US 8,450,145 B2
(45) Date of Patent: May 28, 2013

(54) NONVOLATILE SEMICONDUCTOR MEMORY DEVICE AND METHOD FOR PRODUCING THE SAME

(75) Inventor: Yushi Inoue, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 153 days.

(21) Appl. No.: 12/939,640

(22) Filed: Nov. 4, 2010

(65) Prior Publication Data

US 2011/0140069 A1 Jun. 16, 2011

(30) Foreign Application Priority Data

Dec. 16, 2009 (JP) .................................. 2009-285074
Mar. 30, 2010 (JP) .................................. 2010-079491

(51) Int. Cl.
*H01L 21/00* (2006.01)

(52) U.S. Cl.
USPC .............. 438/104; 257/E21.46; 257/E21.459

(58) Field of Classification Search
USPC ................... 257/5, E21.09, E21.37, E21.395, 257/E21.459, E21.46; 438/382, 104, 102
See application file for complete search history.

(56) References Cited

U.S. PATENT DOCUMENTS

| 5,166,084 | A | * | 11/1992 | Pfiester | ......................... | 438/151 |
| 7,037,762 | B2 | * | 5/2006 | Joo et al. | ....................... | 438/128 |
| 2009/0003045 | A1 | * | 1/2009 | Chen | .............................. | 365/163 |
| 2009/0273964 | A1 | * | 11/2009 | Yamazaki et al. | ............. | 365/148 |

FOREIGN PATENT DOCUMENTS

| JP | 2004-363604 | 12/2004 |
| JP | 2006-165535 | 6/2006 |
| JP | 2008-198941 | 8/2008 |
| JP | 2008-294201 | 12/2008 |
| JP | 2009-021524 | 1/2009 |
| JP | 2009-111280 | 5/2009 |
| JP | 2009-260052 | 11/2009 |

OTHER PUBLICATIONS

Baek et al., "Highly Scalable Non-Volatile Resistive Memory using Simple Binary Oxide Driven by Asymmetric Unipolar Voltage Pulses", IEDM Technology Digest, Dec. 2004, 4 pages.
Wei et al., "Highly Reliable TaOx ReRam and Direct Evidence of Redox Reaction Mechanism", IEDM Technology Digest, Dec. 2004, pp. 293-296.
Zhuang et al., "Novell Colossal Magnetoresistive Thin Film Nonvolatile Resistance Random Access Memory (RRAM)", IEDM Technical Digest, pp. 193-196., Dec. 2002.

* cited by examiner

*Primary Examiner* — Wael Fahmy
*Assistant Examiner* — Sarah Salerno
(74) *Attorney, Agent, or Firm* — Nixon & Vanderhye P.C.

(57) ABSTRACT

A first opening and a second opening are formed at the same time over a first metal wiring and a second metal wiring, respectively which are provided as the same layer on a substrate on which a transistor for selecting a memory cell is formed. Then, a variable resistor and an upper electrode are deposited on a whole surface so as to completely fill the first opening with the upper electrode but not to completely fill the second opening with it. Thereafter, a variable resistive element is formed in the first opening and a via hole to connect to the third metal wiring (bit line), in the second opening, at the same time, by performing back-etching until a surface of the second metal wiring is exposed at a bottom of the second opening.

7 Claims, 39 Drawing Sheets

NONVOLATILE SEMICONDUCTOR MEMORY DEVICE AND METHOD FOR PRODUCING THE SAME

CROSS REFERENCE TO RELATED APPLICATION

This Nonprovisional application claims priority under 35 U.S.C. §119(a) on Patent Applications No. 2009-285074 filed in Japan on Dec. 16, 2009 and No. 2010-079491 filed in Japan on Mar. 30, 2010 the entire contents of which are hereby incorporated by reference.

BACKGROUND OF THE INVENTION

1. Field of the Invention

The present invention relates to a nonvolatile semiconductor memory device and more particularly to a nonvolatile semiconductor memory device using a variable resistive element having a first electrode, a second electrode, and a variable resistor formed between those electrodes, in which a resistance state represented by current-voltage characteristics between both electrodes is reversibly shifted to two or more different resistance states by applying a voltage between those electrodes, and the shifted resistance state can be maintained in a nonvolatile manner, and a method for producing the same.

2. Description of the Related Art

With the spread of a mobile electronic equipment, a large-capacity and inexpensive nonvolatile memory is required to be capable of holding stored data while a power is off. In order to meet the request, nonvolatile memories have been increasingly developed such as a flash memory, ferroelectric memory (FeRAM), a magnetoresistance-change memory (MRAM), a phase-change memory (PCRAM), a solid electrolyte memory (CBRAM), and resistance-change memory (RRAM) (refer to W. W Zhuang et al., "Novell Colossal Magnetoresistive Thin Film Nonvolatile Resistance Random Access Memory (RRAM)", IEDM Technical Digest, pp. 193 to 196, December, 2002). Among the above nonvolatile memories, the RRAM especially attracts an attention because high-speed writing can be performed, and a simple binary transition metal oxide can be used as its material, so that it can be easily produced and has high affinity for an existing CMOS process.

In a memory cell array using the RRAM, a combination of a memory cell and an array structure which can implement the highest capacity is a cross-point type memory cell array having a 1R structure. However, when the cross-point type memory cell array having the 1R structure is used, it is necessary to take measures against a leak current. Thus, as a current limit element to avoid the problem of the leak current, a memory cell structure called a 1T1R structure having a transistor, or a 1D1R structure having a diode has been proposed (refer to Japanese Patent Application Laid-Open No. 2004-363604, Japanese Patent Application Laid-Open No. 2008-198941, I. G. Baek et al., "Highly Scalable Non-volatile Resistive Memory using Simple Binary Oxide Driven by Asymmetric Unipolar Voltage Pulses", IEDM Technical Digest, December, 2004, and Z. Wei et al., "Highly Reliable TaOx ReRAM and Direct Evidence of Redox Reaction Mechanism", IEDM Technical Digest, pp. 293-296, December, 2008).

FIG. 12 is a structural cross-sectional view of a memory cell array 500 of a nonvolatile semiconductor memory device according to the above conventional technique, and FIG. 13 is an equivalent circuit diagram. In this configuration, one memory cell is composed of a selection transistor 502 and a variable resistive element 504. The selection transistor 502 is composed of a gate insulation film 510, a gate electrode 512, a drain region 514, and a source region 516, and formed on an upper surface of a semiconductor substrate 508 in which an element isolation region 506 is formed. In addition, the variable resistive element 504 is composed of a lower electrode 522, a variable resistor 524, and an upper electrode 526.

The gate electrode 512 of the transistor 502 serves as a word line (WL), and a source line (SL) 518 is electrically connected to the source region 516 of the transistor 502 through a contact plug 536 formed in a first interlayer insulation film 532. In addition, a bit line (BL) 520 is electrically connected to the upper electrode 526 of the variable resistive element 504 covered with an interlayer insulation film 534 through a contact plug 539 formed in the third interlayer insulation film 534, while the lower electrode 522 of the variable resistive element 504 is electrically connected to the drain region 514 of the transistor 502 through a contact plug 538 and a metal wiring 519 formed in a second interlayer insulation film 533, and a contact plug 537 formed in the first interlayer insulation film 532. Furthermore, the bit line 520 is also connected to a lower layer metal wiring 521 to connect to a peripheral circuit through a contact plug 535. In addition, in the memory cell array 500, the two memory cells share the one source line 518 as shown in the equivalent circuit diagram in FIG. 13.

Thus, according to the configuration in which the selection transistor 502 and the variable resistive element 504 are arranged in series, the transistor in the memory cell selected by a potential change of the word line 512 is turned on, and programming or erasing can be selectively performed only in the variable resistive element 504 in the memory cell selected by a potential change of the bit line 520.

The conventional memory cell array 500 shown in FIG. 12 is normally produced according to a flowchart shown in FIG. 14. In addition, steps in the following description correspond to steps of the flowchart shown in FIG. 14, respectively.

First, the element isolation region 506 (such as STI Shallow Trench Isolation) and the transistor 502 (such as MOS transistor) are formed on the semiconductor substrate 508 by the well-known technique, the first interlayer insulation film 532 is formed by the well-known technique, the contact plug 536 to connect to the source region 516 of the transistor 502, and the contact plug 537 to connect to the drain region 514 of the transistor 502 are formed, and the metal wiring (source line) 518 and the metal wiring 519 are formed on the contact plug 536 and the contact plug 537, respectively (step #601: metal wiring formation step).

Then, the second interlayer insulation film 533 is formed (step #602: interlayer insulation film formation step), and an opening is formed over the metal wiring 519 connected to the drain region 514 of the transistor 502 through the contact plug 537 so as to penetrate the interlayer insulation film 533 on the metal wiring 519, by the well-known technique (step #603: opening formation step).

Then, the opening over the metal wiring 519 is filled to form the contact plug 538 (step #604: plug formation step) by the well-known technique, and then the lower electrode 522, the variable resistor 524, and the upper electrode 526 of the variable resistive element 504 are sequentially deposited (step #605: lower electrode film deposition step, step #606: variable resistor film deposition step, and step #607: upper electrode film deposition step).

Then, the lower electrode 522, the variable resistor 524, and the upper electrode 526 are patterned by well-known photolithography and etching, to form the variable resistive element 504 (step #608: variable resistive element formation step).

Then, the third interlayer insulation film 534 is formed (step #609: interlayer insulation film formation step), and then the opening is formed over the upper electrode 526 of the variable resistive element 504 by the well-known technique (step #610: opening formation step).

Then, the opening over the upper electrode 526 is filled to form the contact plug 539 by the well-known technique (step #611: plug formation step) and then the metal film is deposited (step #612: metal film deposition step), and the metal film is patterned by well-known photolithography and etching, whereby the upper layer metal wiring (bit line) 520 connected to the contact plug 539 is formed (step #613: metal wiring formation step).

Thus, in producing the conventional nonvolatile semiconductor memory device, it is necessary to form the variable resistive element 504, the contact plug 538 to electrically connect the lower electrode 522 and the metal wiring 519, the contact plug 539 to electrically connect the upper electrode 526 and the metal wiring 520, and the contact plug 535 to electrically connect the lower layer metal wiring 521 in the peripheral circuit and the upper layer metal wiring 520 by repeating the process steps using photolithography, which causes the photomask number to increase, and the production steps to become complicated.

SUMMARY OF THE INVENTION

The present invention was made in view of the above problems, and it is an object of the present invention to provide a nonvolatile semiconductor memory device having a structure in which the number of photomasks is reduced, the number of production steps is reduced, the cost is low, and productivity and yieldability are superior, and a method for producing the same.

As first characteristics, a nonvolatile semiconductor memory device according to the present invention to attain the above object includes a plurality of variable resistive elements arranged in the form of a matrix, and the variable resistive element includes a first electrode, a second electrode, and a variable resistor sandwiched between the first electrode and the second electrode, in which a resistance state represented by current-voltage characteristics between the first electrode and the second electrode is shifted to two or more different states by applying a voltage between the first electrode and the second electrode, and the shifted resistance state is maintained in a nonvolatile manner, wherein a first opening is formed over a first metal wiring so as to penetrate an interlayer insulation film provided on the first metal wiring, and a second opening is formed over a second metal wiring provided as the same layer as the first metal wiring so as to penetrate the interlayer insulation film provided on the second metal wiring, and the variable resistor is formed on at least a whole bottom of the first opening having the bottom and side walls so as to be in contact with the first metal wiring, and the first electrode is formed to cover the variable resistor provided on the bottom, so that the variable resistive element is formed of the variable resistor, the first electrode, and the second electrode which is at least one part of the first metal wiring, and the variable resistor exists in an inner peripheral part of a bottom of the second opening along its side walls, and a contact region not having the variable resistor is provided in a center part of the bottom of the second opening, and a third metal wiring is formed to be directly connected to the second metal wiring through the contact region.

In addition to the first characteristics, as second characteristics, in the nonvolatile semiconductor memory device according to the present invention, the side walls of the first opening and the side walls of the second opening are all covered with the variable resistor.

In addition to the first or second characteristics, as third characteristics, in the nonvolatile semiconductor memory device according to the present invention, the first electrode is filled in the first opening in the form of a plug.

Regarding the nonvolatile semiconductor memory device according to any one of the first to third characteristics, the two kinds of openings are formed in the same interlayer insulation film so as to penetrate the interlayer insulation film, the variable resistive element is formed on the first metal wiring in the first opening, and a via hole is formed on the second metal wiring, to connect the second metal wiring and the third metal wiring, in the second opening.

Thus, since it is not necessary to separately form the contact plug to connect the first metal wiring and the second electrode, the provided nonvolatile semiconductor memory device has the structure in which the number of photomasks is reduced, and the cost is low, and productivity and yieldability are superior.

Furthermore, the provided nonvolatile semiconductor memory device has the structure in which the formation of the variable resistive element in the first opening can be surely separated from the ohmic contact between the second metal wiring and the third metal wiring through the second opening with a simple production step.

In addition to any one of the first to third characteristics, as fourth characteristics, in the nonvolatile semiconductor memory device according to the present invention, an opening area of the second opening is larger than an opening area of the first opening.

Regarding the nonvolatile semiconductor memory device according to the fourth characteristics, by differentiating the opening areas between the first and second openings, the variable resistive element and the via hole to connect the second metal wiring and the third metal wiring are separately formed for sure in the first opening having the small opening area and the second opening having the large opening area, respectively.

Furthermore, since the opening area of the second opening is large, an area of the contact region in the second opening is large, so that contact resistance between the second metal wiring and the third metal wiring is reduced and preferable ohmic contact is implemented.

In addition to any one of the first to fourth characteristics, as fifth characteristics, in the nonvolatile semiconductor memory device according to the present invention, the third metal wiring is directly connected to both of the second metal wiring, and the first electrode formed in the first opening.

Regarding the nonvolatile semiconductor memory device according to the fifth characteristics, since the second metal wiring is electrically connected to the first electrode through the third metal wiring, the third metal wiring can constitute a partial wiring, so that the provided nonvolatile semiconductor memory device has the structure in which the cost is low and productivity and yieldability are superior.

In addition to any one of the first to fifth characteristics, as sixth characteristics, in the nonvolatile semiconductor memory device according to the present invention, the plurality of first openings are arranged in row and column directions over the first metal wirings in the form of a matrix, and the first electrodes belonging to the same column are connected to each other by the third metal wiring extending in the column direction, and a plurality of selection elements each having one end connected to the second electrode through the first metal wiring with an island shape are provided with respect to each of the first openings, and the other ends of the selection elements belonging to the same row are connected to each other through a fourth wiring extending in the row direction.

Regarding the nonvolatile semiconductor memory device according to the sixth characteristics, since the memory cell has the variable resistive element and the selection element connected in series, the highly reliable nonvolatile semiconductor memory device in which the leak current is prevented, and the writing and reading operations of the variable resistive element can be stably performed, can be implemented at low cost.

In addition to the sixth characteristics, as seventh characteristics, in the nonvolatile semiconductor memory device according to the present invention, the selection element is a transistor.

In addition to the seventh characteristics, as eighth characteristics, in the nonvolatile semiconductor memory device according to the present invention, the selection element is a thin film transistor.

Regarding the nonvolatile semiconductor memory device according to the seventh or eighth characteristics, since the versatile LSI process which has been conventionally used can be used in the production process, the provided nonvolatile semiconductor memory device has the structure in which the process can be easily made up. In addition, since the thin film transistor (TFT) is used as the selection element, the provided nonvolatile semiconductor memory device has the structure which can be easily produced on a glass substrate which is used to produce a liquid crystal display.

In addition to any one of the first to fifth characteristics, as ninth characteristics, in the nonvolatile semiconductor memory device according to the present invention, the plurality of first openings are arranged in row and column directions over the first metal wirings in the form of a matrix, and the first electrodes belonging to the same column are connected to each other by the third metal wiring extending in the column direction, and the second electrodes belonging to the same row are connected to each other by the first metal wiring extending in the row direction.

Regarding the nonvolatile semiconductor memory device according to the ninth characteristics, since the first opening is formed in an intersection of the first metal wiring extending in the row direction and the third metal wiring extending in the column direction, and the variable resistive element is formed in the first opening, the cross-point nonvolatile semiconductor memory device which is low in cost and superior in productivity and yieldability can be provided.

In addition to any one of the first to ninth characteristics, as tenth characteristics, in the nonvolatile semiconductor memory device according to the present invention, the variable resistor is formed of a transition metal oxide or an aluminum oxide, or a transition metal oxynitride.

In addition to the tenth characteristics, as eleventh characteristics, in the nonvolatile semiconductor memory device according to the present invention, the variable resistor is formed of an oxide or an oxynitride containing one element selected from at least Ni, Co, Ti, Ta, Hf, W, Cu, and Al.

Regarding the nonvolatile semiconductor memory device according to the eleventh characteristics, since the versatile material which has been conventionally used in the semiconductor process can be used, the provided nonvolatile semiconductor memory device has the structure in which the process can be easily made up.

As first characteristics, a method for producing a nonvolatile semiconductor memory device according to the present invention to attain the above object is the method for producing the nonvolatile semiconductor memory device according to the first characteristics, and includes a step of forming a first metal wiring and a second metal wiring on a substrate, and forming a variable resistor on the first metal wiring and the second metal wiring, a step of forming an interlayer insulation film on a whole surface to cover the variable resistor, a step of forming a first opening having a depth to reach the variable resistor, in the interlayer insulation film on the first metal wiring, and forming a second opening having a depth to reach the variable resistor, in the interlayer insulation film on the second metal wiring, a step of depositing a first electrode on a whole surface so as to completely fill the first opening but not to completely fill and not to cover in the second opening, a step of back-etching the first electrode until a surface of the variable resistor is exposed in the second opening, with the first opening filled with the first electrode, a step of back-etching the variable resistor on the second metal wiring until a surface of the second metal wiring is exposed in the second opening, with the first opening filled with the first electrode, and a step of forming a third metal wiring on the second metal wiring exposed in the second opening, and on the first electrode formed in the first opening.

In addition to the first characteristics, as second characteristics, in the method for producing the nonvolatile semiconductor memory device according to the present invention, the variable resistor is deposited on a whole surface in the step of forming the variable resistor.

As third characteristics, a method for producing a nonvolatile semiconductor memory device according to the present invention to attain the above object is the method for producing the nonvolatile semiconductor memory device according to the first characteristics, and includes a step of forming a first metal wiring and a second metal wiring both containing an uppermost oxidization target metal film, on a substrate, a step of forming an interlayer insulation film on a whole surface to cover the first metal wiring and the second metal wiring, a step of forming a first opening having a depth to reach the oxidization target metal film, in the interlayer insulation film on the first metal wiring, and forming a second opening having a depth to reach the oxidization target metal film, in the interlayer insulation film on the second metal wiring, a step of oxidizing the oxidization target metal films exposed at bottoms of the first opening and the second opening, and forming a variable resistor of an oxide of the oxidization target metal film, a step of depositing a first electrode on a whole surface so as to completely fill the first opening but not to completely fill and not to cover in the second opening, a step of back-etching the first electrode until a surface of the variable resistor is exposed in the second opening, with the first opening filled with the first electrode, a step of removing the variable resistor exposed in the second opening by back-etching, with the first opening filled with the first electrode, and a step of forming a third metal wiring on the second metal wiring exposed in the second opening, and on the first electrode formed in the first opening.

As fourth characteristics, a method for producing a nonvolatile semiconductor memory device according to the present invention to attain the above object is the method for producing the nonvolatile semiconductor memory device according to any one of the second to fifth characteristics, and includes a step of forming a first metal wiring and a second metal wiring on a substrate, a step of forming an interlayer insulation film on a whole surface to cover the first metal wiring and the second metal wiring, a step of forming a first opening having a depth to reach the first metal wiring, in the interlayer insulation film on the first metal wiring, and forming a second opening having a depth to reach the second metal wiring, in the interlayer insulation film on the second metal wiring, a step of depositing a variable resistor on a whole surface so as not to completely fill the first opening and the second opening, and so as not to cover in the first opening and the second opening, a step of depositing a first electrode on a whole surface so as to completely fill the first opening but not to completely fill and not to cover in the second opening, a step of back-etching the first electrode until a surface of the variable resistor is exposed in the second opening, with the first opening filled with the first electrode, a step of back-etching the variable resistor until a surface of the second metal wiring is exposed in the second opening, with the first opening filled with the first electrode, and a step of forming a third metal wiring on the second metal wiring exposed in the second opening, and on the first electrode formed in the first opening.

Regarding the method for producing the nonvolatile semiconductor memory device according to any one of the first to fourth characteristics, the two kinds of openings are formed in the same interlayer insulation film at the same time so as to penetrate the interlayer insulation film, and after the first electrode has been deposited, the variable resistive element is formed in the first opening on the first metal wiring, and the via hole to connect the second metal wiring and the third metal wiring is formed in the second opening on the second metal wiring by back-etching at the same time. Thus, the produced nonvolatile semiconductor memory device has the structure in which the number of photomasks is reduced at the time of production, the cost is low, and productivity and yieldability are superior.

When the metal film is deposited in the first opening and the second opening, for example, the first opening is completely filled with the metal film while the second opening is not completely filled with the metal film by adjusting a film thickness of the deposited metal film. As a result, after the metal film has been deposited all over the metal wiring, when the metal film is back-etched and removed until the surface of the base metal wiring layer is exposed in the second opening, the metal film is left on the side walls of the second opening, while the metal wiring layer is exposed at the bottom, so that the via hole can be formed to connect the metal wiring layers. Meanwhile, the filled metal film remains in the bottom and the side walls of the first opening after the back-etching. According to the present invention, after the first and second openings have been formed, at least the first electrode of the first electrode and the variable resistor is deposited all over, and the back-etching is performed, whereby the first electrode of the variable resistive element can be processed in the first opening, and the contact region in which the second metal wiring is exposed is formed in the bottom of the second opening, at the same time. Thus, the second metal wiring and the third metal wiring can be directly connected in the contact region.

Therefore, the formation of the variable resistive element in the first opening can be surely separated from the ohmic contact between the second metal wiring and the third metal wiring through the second opening, with a simple production step.

Furthermore, since the number of steps of processing the first electrode and the second electrode of the variable resistive element, and the variable resistor can be reduced, and it is not necessary to separately form the contact plug to connect the first metal wiring and the second electrode, the provided nonvolatile semiconductor memory device has the structure in which the cost is low and the productivity and yieldability are superior.

In addition to any one of the first to fourth characteristics, as fifth characteristics, in the method for producing the nonvolatile semiconductor memory device according to the present invention, an opening area of the second opening is formed to be larger than an opening area of the first opening, in the step of forming the first opening and the second opening.

According to the present invention, size and shape of the opening are set based on film thicknesses of the metal film and the variable resistor to be etched and an etching method so that the variable resistive element is formed in the first opening, and the via hole is formed in the second opening by the back-etching. Regarding the method for producing the nonvolatile semiconductor memory device according to the fifth characteristics, by differentiating the opening areas of the first and second openings, the variable resistive element in the first opening having a small opening area and the via hole in the second opening having a large opening area to connect the second metal wiring and the third metal wiring are surely separated and formed. Furthermore, since the opening area of the second opening is large, an area of the contact region in the second opening is large, so that contact resistance between the second metal wiring and the third metal wiring is reduced and preferable ohmic contact is implemented.

Furthermore, in addition to any one of the first to fifth characteristics, as a sixth characteristics, the method for producing the nonvolatile semiconductor memory device according to the present invention further includes a step of forming a selection element connected to the second electrode of the variable resistive element.

Regarding the method for producing the nonvolatile semiconductor memory device according to the sixth characteristics, since the memory cell has the variable resistive element and the selection element connected in series, the produced nonvolatile semiconductor memory device in which the leak current is prevented, and the writing and reading operations of the variable resistive element can be stably performed, can be implemented with high reliability at low cost.

In addition to the sixth characteristics, as seventh characteristics, in the method for producing the nonvolatile semiconductor memory device according to the present invention, the selection element is a transistor.

In addition to the seventh characteristics, as eighth characteristics, in the method for producing the nonvolatile semiconductor memory device according to the present invention, the selection element is a thin film transistor.

Regarding the method for producing the nonvolatile semiconductor memory device according to the seventh or eighth characteristics, since the transistor is used as the selection element, the versatile LSI process which has been conventionally used can be used, so that the process can be easily made up. In addition, since the thin film transistor (TFT) is used as the selection element, the produced nonvolatile semiconductor memory device can be easily provided on a glass substrate which is used to produce a liquid crystal display.

In addition to any one of the first to eighth characteristics, as ninth characteristics, in the method for producing the nonvolatile semiconductor memory device according to the present invention, the variable resistor is formed of a transition metal oxide or an aluminum oxide, or a transition metal oxynitride.

In addition to the ninth characteristics, as tenth characteristics, in the method for producing the nonvolatile semiconductor memory device according to the present invention, the variable resistor is formed of an oxide or an oxynitride containing one element selected from at least Ni, Co, Ti, Ta, Hf, W, Cu, and Al.

Regarding the method for producing the nonvolatile semiconductor memory device according to the tenth characteristics, since the versatile material conventionally used in the semiconductor process can be used, the process can be easily made up.

Therefore, the present invention provides the nonvolatile semiconductor memory device having the structure in which the number of photomasks is reduced, the production steps are reduced or simplified, the cost is low, and productivity and yieldability are superior.

DETAILED DESCRIPTION OF THE INVENTION

First Embodiment

Hereinafter, a description will be made of a nonvolatile semiconductor memory device according to one embodiment of the present invention (hereinafter, referred to as the "device 100 of the present invention" occasionally), and a method for producing the same (hereinafter, referred to as the "method 1 of the present invention" occasionally), with reference to the drawings.

Figure 1:
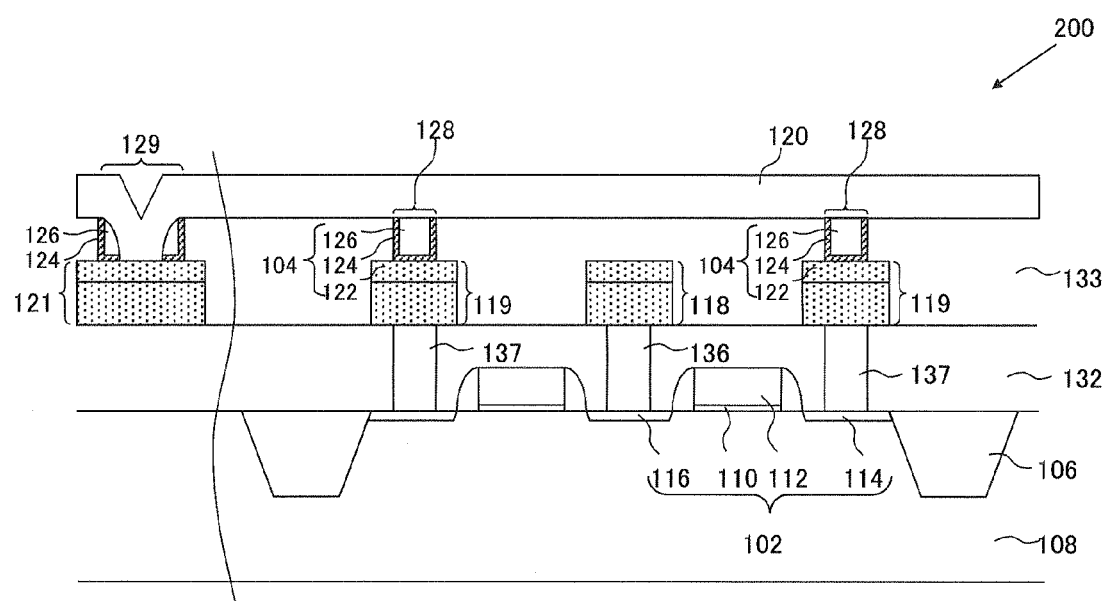
FIG. 1 is a schematic structural cross-sectional view of a memory cell array of a nonvolatile semiconductor memory device according to the present invention.

FIG. 1 is a schematic structural cross-sectional view of a memory cell array 200 in the device 100 of the present invention according to this embodiment. In addition, in the following structural cross-sectional views, an essential part is appropriately emphasized, and a dimension scale of each component in the drawing does not always coincide with an actual dimension scale. This is the same in the following embodiments.

As shown in FIG. 1, the memory cell array 200 is configured by arranging variable resistive elements 104 formed on island-shaped first metal wirings 119 in first openings 128 (refer to FIG. 4) in a row direction and a column direction, in the form of a matrix. A third metal wiring 120 extends in the column direction and serves as a bit line by which first electrodes 126 of the variable resistive elements belonging to the same column are connected to each other. Meanwhile, a gate electrode 112 of a transistor 102 extends in the row direction (vertical to a sheet surface of FIG. 1), and serves as a word line, and a source line 118 extends in the row direction and is electrically connected to a source region 116 of the transistor 102 through a contact plug 136 formed in a first interlayer insulation film 132. In addition, the transistor 102 is connected to a second electrode 122 of the variable resistive element 104 through a drain region 114, a contact plug 137 formed in the first interlayer insulation film 132, and the island-shaped first metal wiring 119. Thus, the memory cell array 200 has a 1T1R structure.

In each first opening 128, a variable resistor 124 is formed so as to cover a whole surface of a bottom and side walls of the first opening 128, and the first electrode 126 is formed into a plug shape so as to cover the variable resistor 124. Thus, the variable resistive element 104 is composed of the first electrode (upper electrode) 126, the second electrode (lower electrode) 122 serving as an uppermost layer of the first metal wiring 119, and the variable resistor 124. The variable resistor is formed of a transition metal oxide or aluminum oxide, or transition metal oxynitride, and here, formed of a tantalum oxide ($Ta_2O_5$). As other preferable materials, an oxide or oxynitride of Ni, Co, Ti, Hf, W, Cu, Al may be used.

Furthermore, a second opening 129 (refer to FIG. 4) having an opening area larger than that of the first opening 128 is formed over a second metal wiring 121 provided as the same layer as the first metal wiring 119. While a whole surface of side walls of the second opening 129 is covered with the variable resistor 124, the center part of a bottom of the second opening 129 is not covered with the variable resistor, and there is a contact region through which the second metal wiring 121 is exposed, so that the second metal wiring 121 and the bit line 120 are directly connected through the contact region. Thus, the bit line 120 is connected to the second metal wiring 121 through a via hole formed in the second opening 129, whereby the memory cell array 200 is connected to a peripheral circuit such as a bit line decoder (not shown) or a read circuit (not shown).

Each bit line of the memory cell array 200 is connected to the bit line decoder, and each word line is connected to a word line decoder, whereby the device 100 of the present invention is constituted. The device 100 of the present invention can write and read data to and from a memory cell when a selection voltage is applied to a selected memory cell, and a non-selection voltage is applied to an unselected memory cell through the bit line decoder or the word line decoder. In addition, as for specific configurations of the bit line decoder and the word line decoder, and the selection voltage and the non-selection voltage applied to each memory cell in the writing and reading operations of the memory cell, various kinds of well-known configurations can be used, so that their descriptions are omitted here. In addition, various kinds of well-known configurations are also used for the configuration of the read circuit used in the reading operation, but these are not the point of the present invention, so that a description for them is omitted.

Next, a description will be made in detail of the method for producing the device 100 of the present invention (method 1 of the present invention) with reference to the drawings.

FIGS. 2 to 8 are schematic structural cross-sectional views in steps to produce the device 100 of the present invention. In addition, FIG. 9 is a flowchart showing production steps of the device 100 of the present invention. In addition, each step in the following description represents each step of the flowchart in FIG. 9. In addition, a numerical value of a film thickness of each film deposited in each production step is only one example, and the film thickness is not limited to that value. This is the same in the following embodiments.

Figure 2:
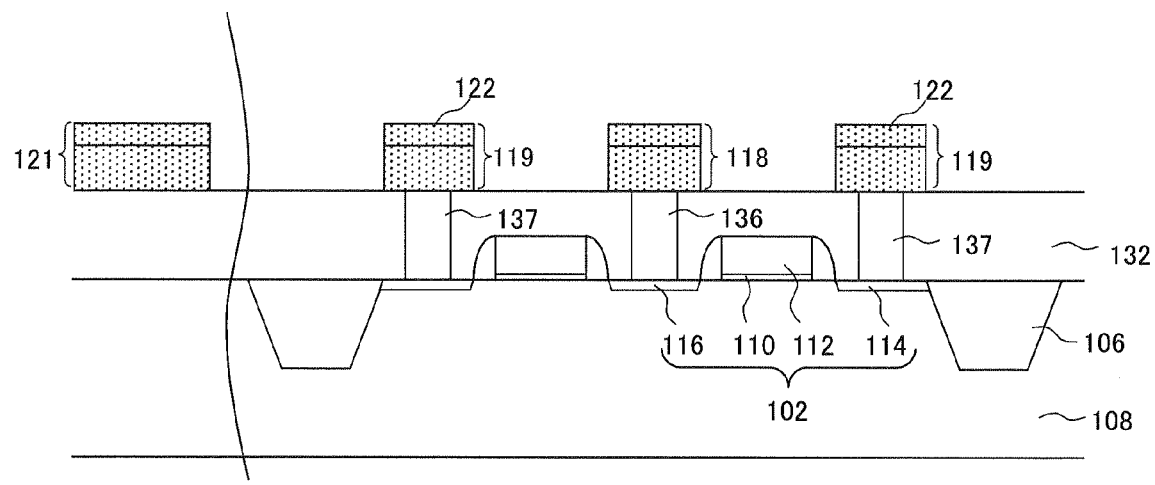
FIG. 2 is a schematic structural cross-sectional view in a production step of the nonvolatile semiconductor memory device according to the present invention.

First, as shown in FIG. 2, an element isolation region 106, and the transistor 102 composed of a gate insulation film 110, the gate electrode 112, the drain region 114, and the source region 116 are formed on a semiconductor substrate 108, and then the first interlayer insulation film 132 is deposited thereon, and the contact plug 136 to connect to the source region 116 and the contact plug 137 to connect to the drain region 114 are appropriately formed. Then, the source line 118, the first metal wiring 119, and the second metal wiring 121 having a TiN/Ti/AlCu/TiN/Ti structure deposited by sputtering, for example, are formed by well-known etching, using a resist pattern formed by well-known photolithography as a mask (step #301: metal wiring formation step). A TiN film formed as an uppermost layer having a film thickness of about 60 nm in the first metal wiring 119 serves as the lower electrode (second electrode) 122 of the variable resistive element.

Alternatively, the source line 118, the first metal wiring 119, and the second metal wiring 121 may be formed in such a manner that after an interlayer insulation film has been formed, a trench formed in the interlayer insulation film is filled by the well-known damascene technique using Cu.

Figure 3:
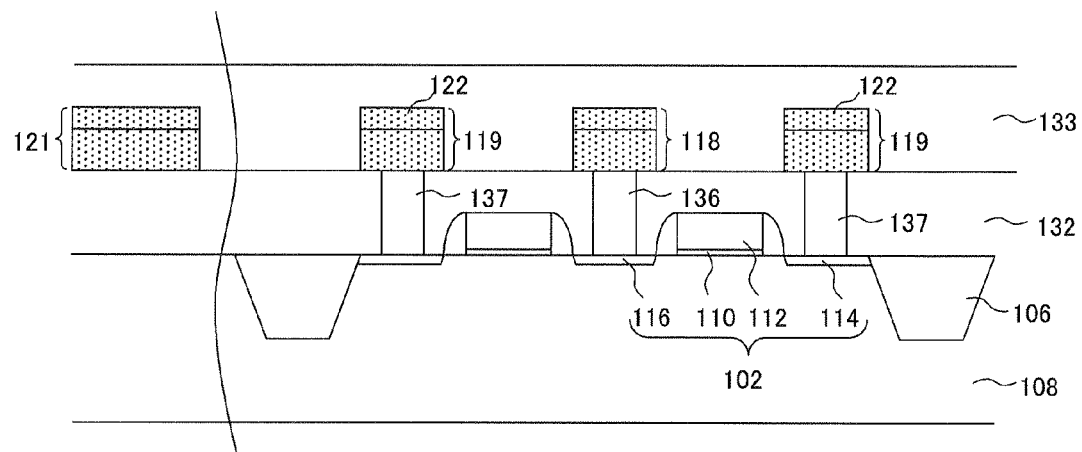
FIG. 3 is a schematic structural cross-sectional view in a production step of the nonvolatile semiconductor memory device according to the present invention.

Then, as shown in FIG. 3, a $SiO_2$ film 133 serving as a second interlayer insulation film is deposited by plasma CVD on a whole surface so as to cover the first and second metal wirings to be 200 nm in thickness on the metal wirings, for example (step #302: interlayer insulation film formation step). Alternatively, at this time, the second interlayer insulation film 133 may be deposited to be 800 nm in thickness by plasma CVD and then ground to be 200 nm in thickness on the first and second metal wirings by well-known CMP.

Figure 4:
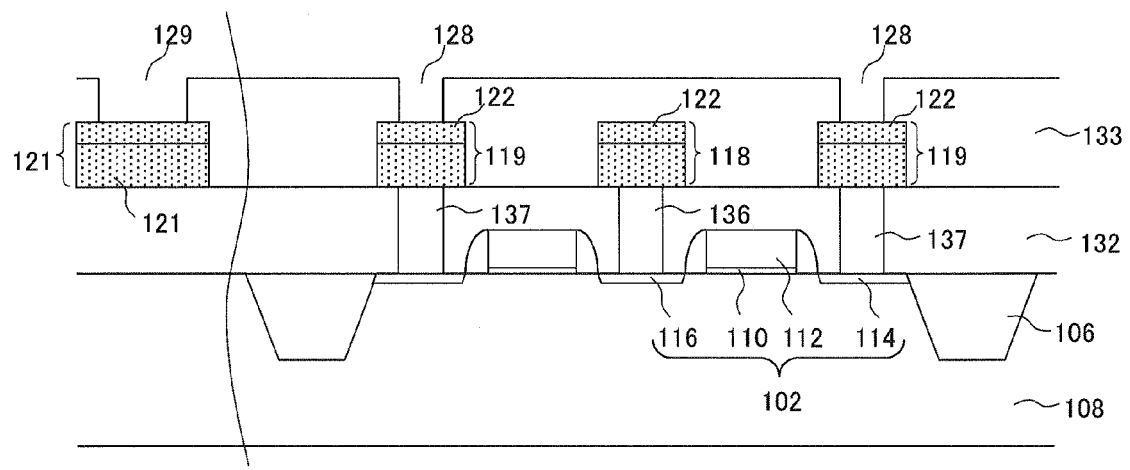
FIG. 4 is a schematic structural cross-sectional view in a production step of the nonvolatile semiconductor memory device according to the present invention.

Then, as shown in FIG. 4, using a resist pattern formed by well-known photolithography as a mask, the first opening 128 is formed in a variable resistive element formation region in the second interlayer insulation film 133 on the first metal wiring 119 so as to reach the first metal wiring 119, and the second opening 129 is formed in a contact hole formation region in the second interlayer insulation film 133 on the second metal wiring 121 so as to reach the second metal wiring 121, at the same time by well-known etching (step #303: opening formation step).

At this time, shapes and sizes of the first opening 128 and the second opening 129 are set such that the first opening 128 is completely filled with the first electrode while the second opening 129 is not completely filled with the first electrode in a step of depositing an upper electrode (first electrode) which will be described below. For example, the filled states of the first electrode in the openings can be controlled by differentiating short diameters when the openings are in the shape of an ellipsoid, and short sides when the openings are in the shape of a rectangle. In addition, in order to completely fill the first opening 128 with the first electrode, and not to completely fill the second opening 129 with the first electrode, an opening area of the second opening 129 is preferably larger than that of the first opening 128. Here, the first opening is 200 nm in diameter, and the second opening is 600 nm in diameter.

Figure 5:
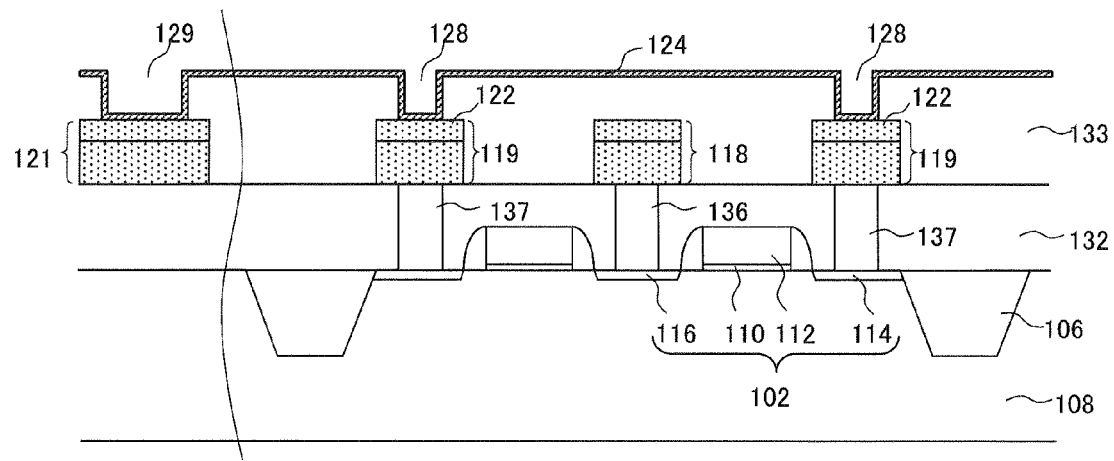
FIG. 5 is a schematic structural cross-sectional view in a production step of the nonvolatile semiconductor memory device according to the present invention.

Then, as shown in FIG. 5, as one example of the variable resistor, the $Ta_2O_5$ film 124 is deposited on a whole surface to be 10 nm in thickness by sputtering so as not to completely fill the first opening 128 and the second opening 129 and not to cover in the first opening 128 and the second opening 129 (step #304: variable resistor film deposition step).

In addition, at this time, it is preferable to perform a surface cleaning process for the metal wiring 119 serving as the lower electrode 122 by reverse sputtering with Ar gas, for example just before the variable resistor 124 is deposited.

Figure 6:
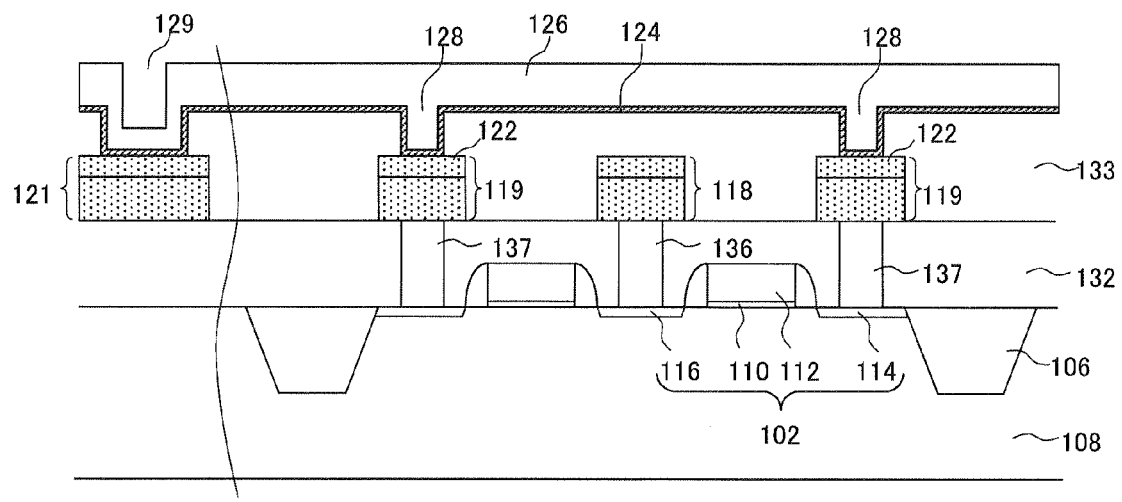
FIG. 6 is a schematic structural cross-sectional view in a production step of the nonvolatile semiconductor memory device according to the present invention.

Then, as shown in FIG. 6, as one example of the upper electrode (first electrode), the film 126 having a W/TiN/Ta structure, for example is deposited on a whole surface to be 200 nm/10 nm/20 nm in thickness, for example by sputtering and CVD so as to completely fill the first opening 128, but not to completely fill the second opening 129 (step #305: upper electrode film deposition step).

Figure 7:
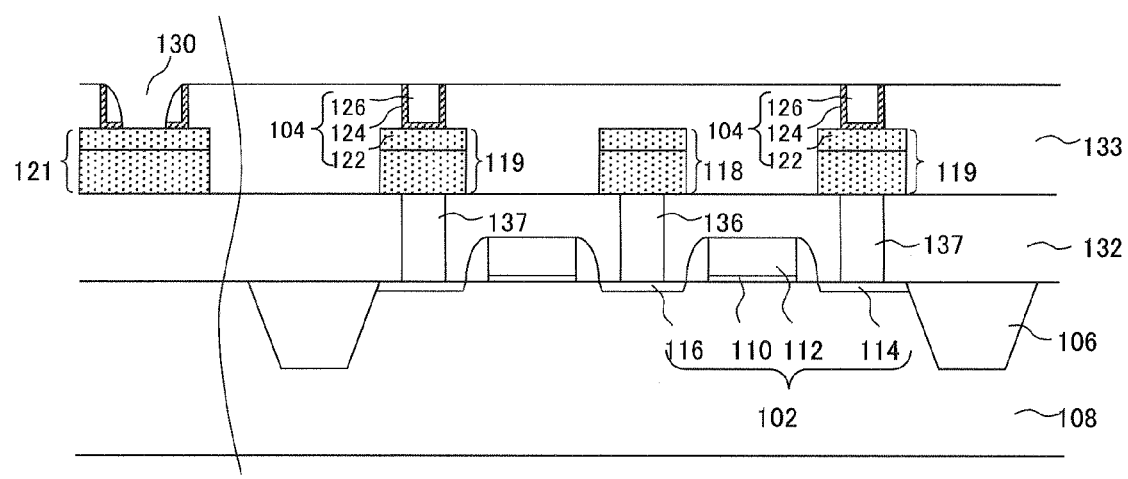
FIG. 7 is a schematic structural cross-sectional view in a production step of the nonvolatile semiconductor memory device according to the present invention.

Then, as shown in FIG. 7, the first electrode 126 is back-etched until the surface of the variable resistor 124 is exposed at the bottom in the second opening 129 by dry etching using $SF_6$, for example to remove the first electrode 126 formed on the second interlayer insulation film 133. Furthermore, the variable resistor 124 is back-etched until the surface of the second metal wiring is exposed at the bottom of the second opening 129, to remove the variable resistor 124 in the bottom of the second opening 129 (step #306: back-etching step). In addition, the back-etching of the first electrode 126 and the back-etching of the variable resistor 124 are sequentially performed. At this time, a back-etching time is adjusted so that the variable resistive element 104 is provided in the first opening 128 in such a manner that the first electrode 126 remains in the shape of a plug, and the $Ta_2O_5$ film as the variable resistor 124 is sandwiched between the first electrode 126 and the second electrode 122.

Thus, the variable resistive element 104 is formed in the first opening 128, and a via hole 130 to connect the second metal wiring 121 and the upper metal wiring is formed in the second opening 129, at the same time.

Figure 8:
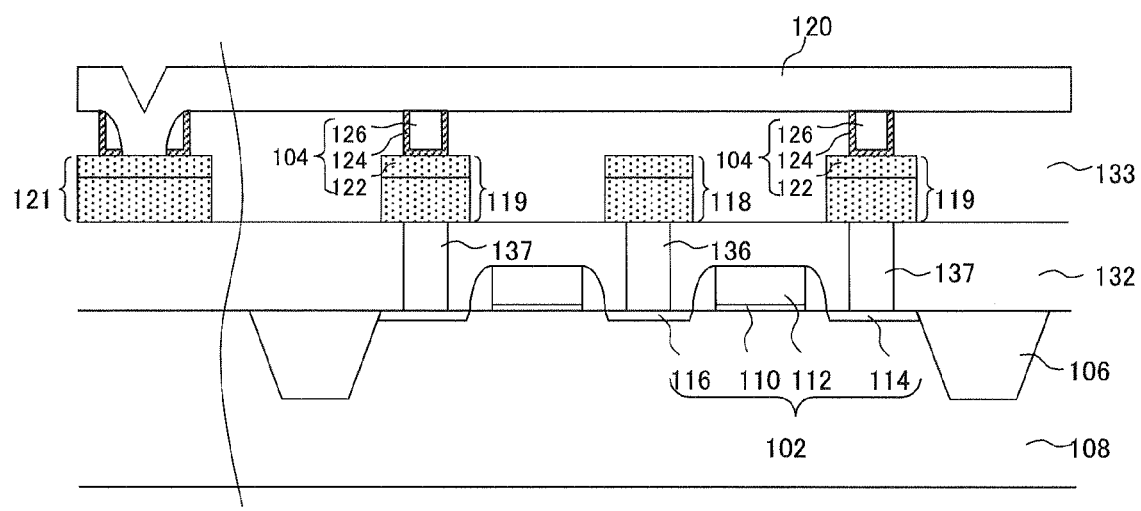
FIG. 8 is a schematic structural cross-sectional view in a production step of the nonvolatile semiconductor memory device according to the present invention.
Figure 9:
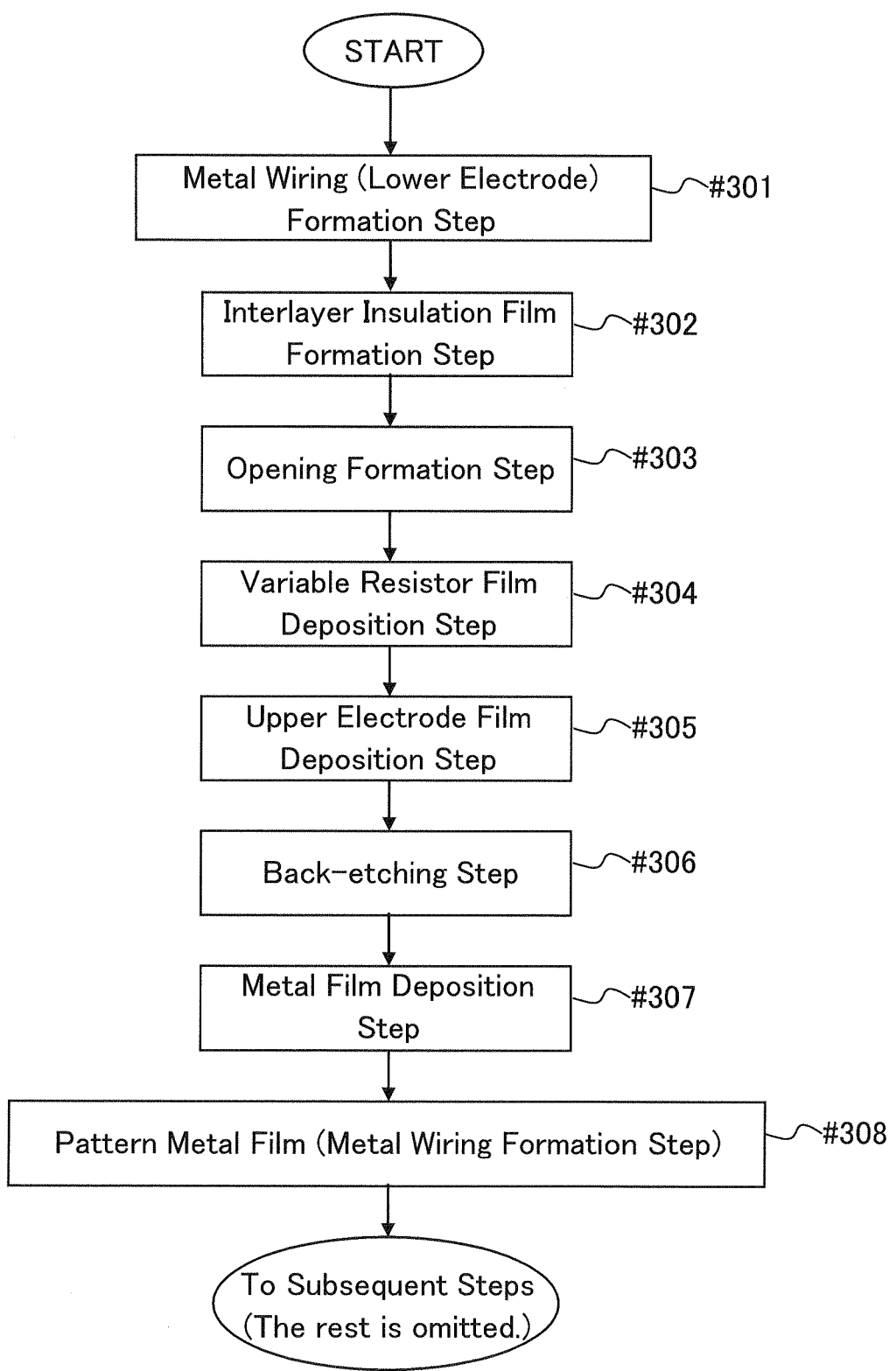
FIG. 9 is a flowchart showing the production steps of the nonvolatile semiconductor memory device according to the present invention.

Then, as shown in FIG. 8, the metal film 120 having a TiN/Ti/AlCu/TiN/Ti structure is deposited on a whole surface by sputtering or the like (step #307: metal film deposition step), and then the metal film is patterned by well-known etching using a resist pattern formed by well-known photolithography as a mask, thereby forming the third metal wiring 120 which is connected to both of the first electrode 126 of the variable resistive element 104 and the second metal wiring 121 (step #308: metal wiring formation step). Thus, the memory cell array 200 is provided as shown in FIG. 1.

Then, an interlayer insulation film is deposited on a whole surface in a subsequent step. On this interlayer insulation film, an upper wiring to connect the peripheral circuits of the memory cell array 200 can be formed when it is needed. Thus, the device 100 of the present invention is produced.

Second Embodiment

In the first embodiment, the description has been made of the case where the first opening 128 and the second opening 129 are formed and then the variable resistor 124 and the first electrode 126 are deposited on the whole surface and then back-etched, whereby the variable resistive element 104 is formed in the first opening 128 and the via hole 130 is formed in the second opening 129, at the same time, but the variable resistor 124 may be formed before the first opening and the second opening are formed so as to penetrate the interlayer insulation film.

Figure 15:
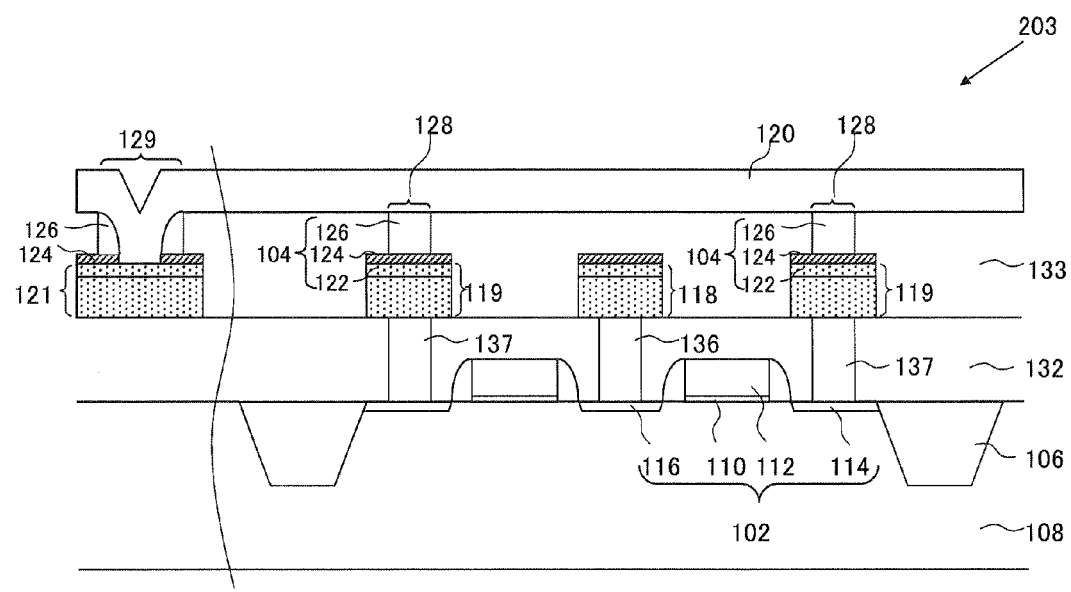
FIG. 15 is a schematic structural cross-sectional view of a memory cell array of a nonvolatile semiconductor memory device according to a second embodiment of the present invention.

Hereinafter, a description will be made of a nonvolatile semiconductor memory device according to one embodiment of the present invention (hereinafter, referred to as the "device 100a of the present invention" occasionally), and a method for producing the same (hereinafter, referred to as the "method 2 of the present invention" occasionally), with reference to the drawings. FIG. 15 is a schematic structural cross-sectional view of a memory cell array 203 in the device 100a of the present invention.

As shown in FIG. 15, similar to the memory cell array 200 in the first embodiment, the memory cell array 203 is configured by arranging variable resistive elements 104 in a row direction and a column direction in the form of a matrix, and has a 1T1R structure composed of a third metal wiring (bit line) 120 extending in the column direction, a gate electrode (word line) 112 of a transistor 102 extending in the row direction, and a source line 118 extending in the row direction.

A variable resistor 124 is formed on the island-shaped first metal wiring 119, and a first opening 128 is formed over the variable resistor 124 so as to penetrate an interlayer insulation film 133 on the variable resistor 124. Each first opening 128 is filled with a first electrode in the form of a plug, and thus, the variable resistive element 104 is composed of a first electrode (upper electrode) 126, a second electrode (lower electrode) 122 serving as an uppermost layer of a first metal wiring 119, and the variable resistor 124. The variable resistor is formed of a transition metal oxide or aluminum oxide, or transition metal oxynitride, and here, formed of a tantalum oxide ($Ta_2O_5$). As other preferable materials, an oxide or oxynitride of Ni, Co, Ti, Hf, W, Cu, Al may be used.

Meanwhile, a second opening 129 (refer to FIG. 18) having an opening area larger than that of the first opening 128 is formed over a second metal wiring 121 provided as the same layer as the first metal wiring 119. The first electrode 126 is formed on side walls of the second opening 129 and the variable resistor remains in the inner peripheral part of the bottom of the second opening 129 along the side walls. Meanwhile, in the center part of the bottom of the second opening 129, a contact region in which the variable resistor is not formed and the second metal wiring 121 is exposed is provided, and the second metal wiring 121 and the bit line 120 are directly connected through the contact region. Thus, the bit line 120 is also connected to the second metal wiring 121 through a via hole formed in the second opening 129, whereby the memory cell array 203 is connected to a peripheral circuit such as a bit line decoder (not shown) or a read circuit (not shown).

Each bit line of the memory cell array 203 is connected to the bit line decoder, and each word line is connected to a word line decoder, whereby the device 100a of the present invention is constituted. Similar to the memory cell array 200 according to the first embodiment, the device 100a of the present invention can write and read data to and from a memory cell when a selection voltage is applied to a selected memory cell, and a non-selection voltage is applied to an unselected memory cell through the bit line decoder or the word line decoder.

Hereinafter, a description will be made in detail of the method for producing the device 100a of the present invention (method 2 of the present invention) with reference to the drawings.

FIGS. 16 to 21 are schematic structural cross-sectional views in production steps to produce the device 100a of the present invention. In addition, FIG. 22 is a flowchart showing the production steps of the device 100a of the present invention. In addition, each step in the following description represents each step of the flowchart in FIG. 22.

Figure 16:
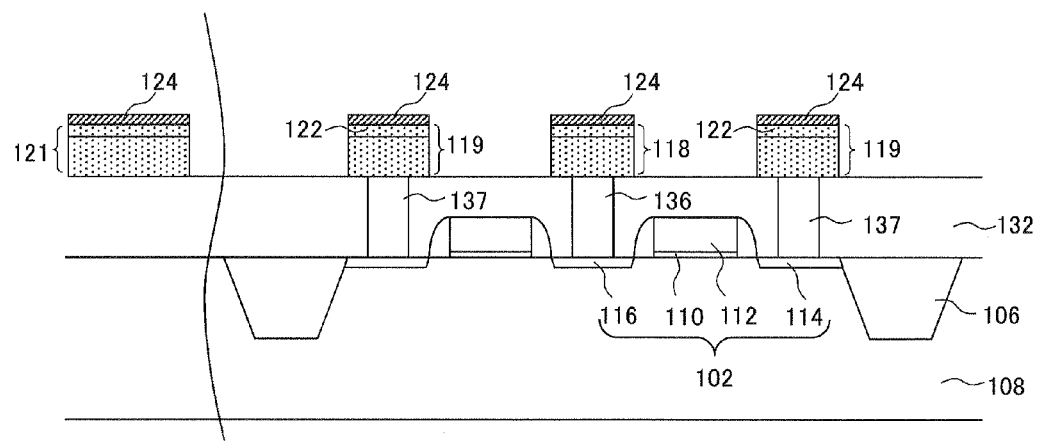
FIG. 16 is a schematic structural cross-sectional view in a production step of the nonvolatile semiconductor memory device according to the second embodiment of the present invention.

First, as shown in FIG. 16, an element isolation region 106, and the transistor 102 composed of a gate insulation film 110, the gate electrode 112, a drain region 114, and a source region 116 are formed on a semiconductor substrate 108, and then a first interlayer insulation film 132 is deposited, and a contact plug 136 to connect to the source region 116 and a contact plug 137 to connect to the drain region 114 are appropriately formed. Then, the source line 118, the first metal wiring 119, and the second metal wiring 121 having a TiN/Ti/AlCu/TiN/Ti structure are deposited to be about 300 nm in thickness by sputtering, and a tantrum oxide film ($Ta_2O_5$) is deposited to be about 10 nm in thickness as the variable resistor 124 on the metal wirings 118, 119, and 121, and they are patterned by well-known etching, using a resist pattern formed by well-known photolithography as a mask (step #701: metal wiring and variable resistor formation steps). A TiN film formed as an uppermost layer having a film thickness of about 60 nm in the first metal wiring 119 serves as the lower electrode (second electrode) 122 of the variable resistive element.

Alternatively, the source line 118, the first metal wiring 119, the second metal wiring 121, and the variable resistor 124 may be formed in such as manner that after the interlayer insulation film has been deposited, a trench formed in the interlayer insulation film is filled by the well-known damascene technique.

Figure 17:
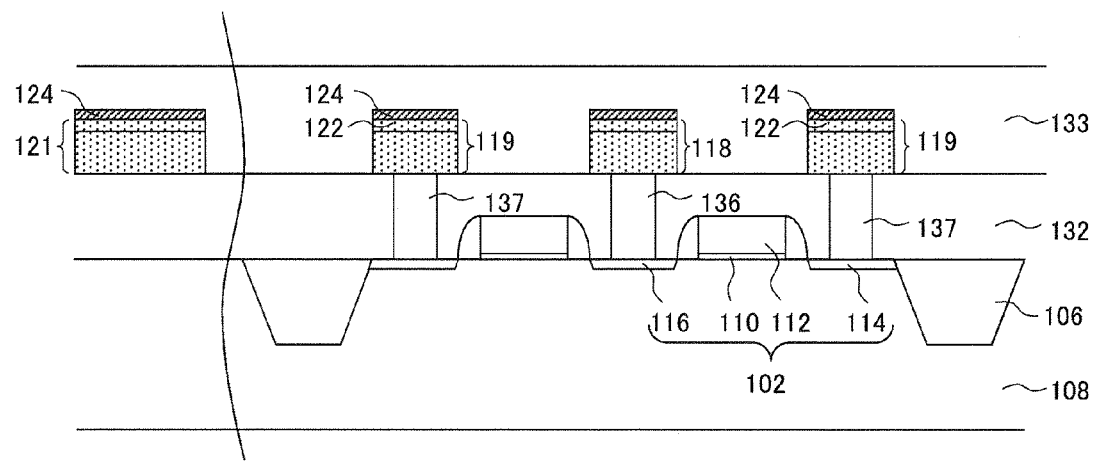
FIG. 17 is a schematic structural cross-sectional view in a production step of the nonvolatile semiconductor memory device according to the second embodiment of the present invention.

Then, as shown in FIG. 17, the $SiO_2$ film 133 serving as the second interlayer insulation film is deposited by plasma CVD on a whole surface so as to cover the variable resistor 124 to be 200 nm in thickness on the metal wirings, for example (step #702: interlayer insulation film formation step). Alternatively, at this time, the second interlayer insulation film 133 may be deposited to be 800 nm in thickness by plasma CVD and then ground to be 200 nm in thickness on the first and second metal wirings by well-known CMP.

Figure 18:
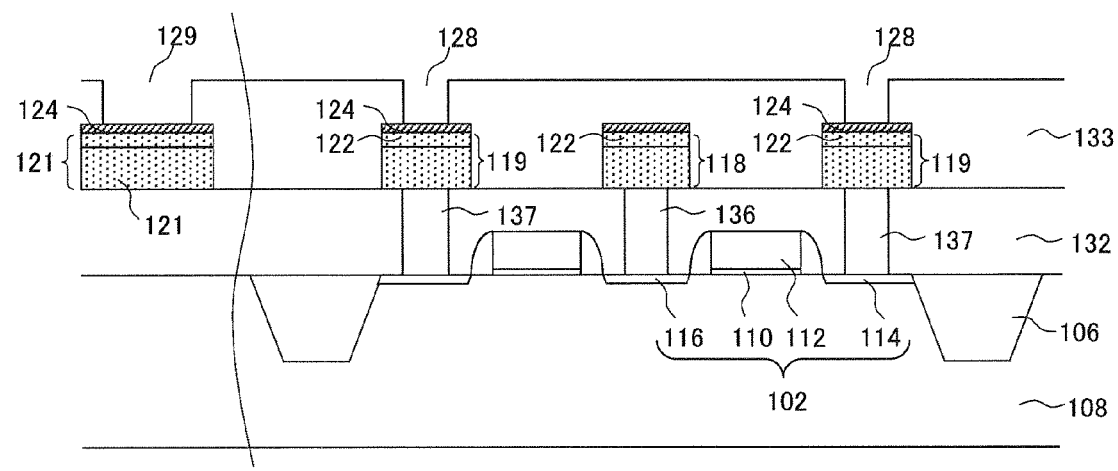
FIG. 18 is a schematic structural cross-sectional view in a production step of the nonvolatile semiconductor memory device according to the second embodiment of the present invention.

Then, as shown in FIG. 18, using a resist pattern formed by well-known photolithography as a mask, the first opening 128 reaching the first metal wiring 119 is formed in a variable resistive element formation region in the second interlayer insulation film 133 on the first metal wiring 119, and the second opening 129 reaching the second metal wiring 121 is formed in a contact hole formation region in the second interlayer insulation film 133 on the second metal wiring 121, at the same time by well-known etching (step #703: opening formation step). At this time, similar to the first embodiment, shapes and sizes of the first opening 128 and the second opening 129 are set such that the first opening 128 is completely filled with the first electrode and the second opening 129 is not completely filled with the first electrode in a step of depositing an upper electrode (first electrode) which will be described below. Here, the first opening is 200 nm in diameter, and the second opening is 600 nm in diameter.

Figure 19:
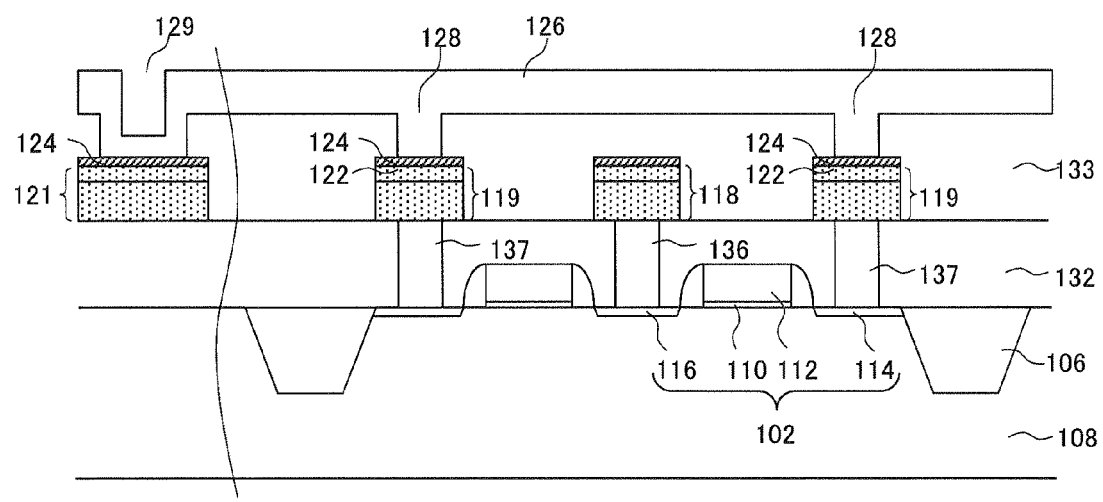
FIG. 19 is a schematic structural cross-sectional view in a production step of the nonvolatile semiconductor memory device according to the second embodiment of the present invention.

Then, as shown in FIG. 19, as one example of the upper electrode (first electrode), the film 126 having a W/TiN/Ta structure, for example is deposited on a whole surface to be 200 nm/10 nm/20 nm in thickness, for example by sputtering and CVD so as to completely fill the first opening 128, and not to completely fill and cover in the second opening 129 (step #704: upper electrode film deposition step).

Figure 20:
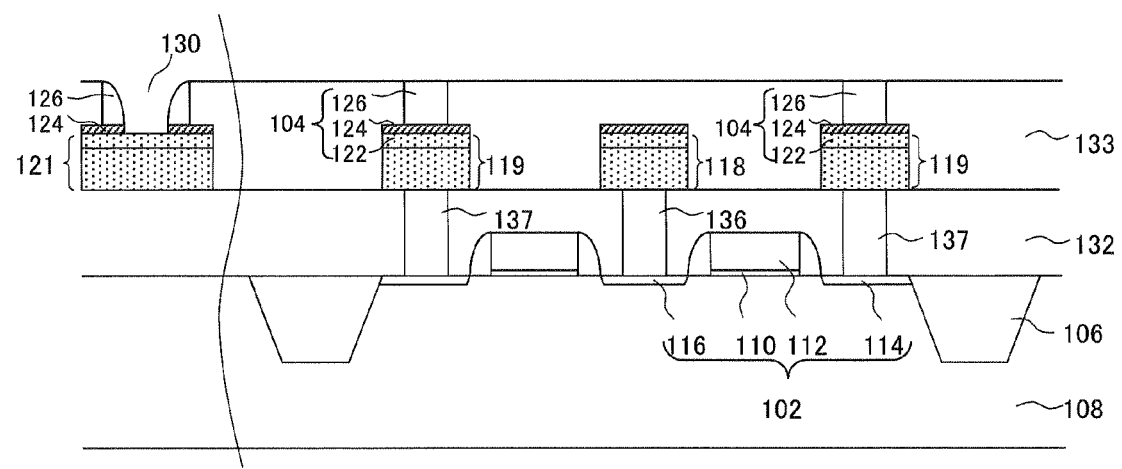
FIG. 20 is a schematic structural cross-sectional view in a production step of the nonvolatile semiconductor memory device according to the second embodiment of the present invention.

Then, as shown in FIG. 20, the first electrode 126 is back-etched until the surface of the variable resistor 124 is exposed at the bottom of the second opening 129 by dry etching using $SF_6$, for example to remove the first electrode 126 on the second interlayer insulation film 133. Then, the variable resistor 124 is back-etched until the surface of the second metal wiring is exposed at the bottom of the second opening 129, to remove the variable resistor 124 in the bottom of the second opening 129 (step #705: back-etching step). In addition, the back-etching of the first electrode 126 and the back-etching of the variable resistor 124 are sequentially performed. At this time, a back-etching time is adjusted so that the variable resistive element 104 is provided in the first opening 128 in such a manner that the first electrode 126 is left in the form of a plug, and $Ta_2O_5$ film as the variable resistor 124 is sandwiched between the first electrode 126 and the second electrode 122.

Thus, the variable resistive element 104 is formed in the first opening 128, and a via hole 130 to connect the second metal wiring 121 and the upper metal wiring is formed in the second opening 129, at the same time.

Figure 21:
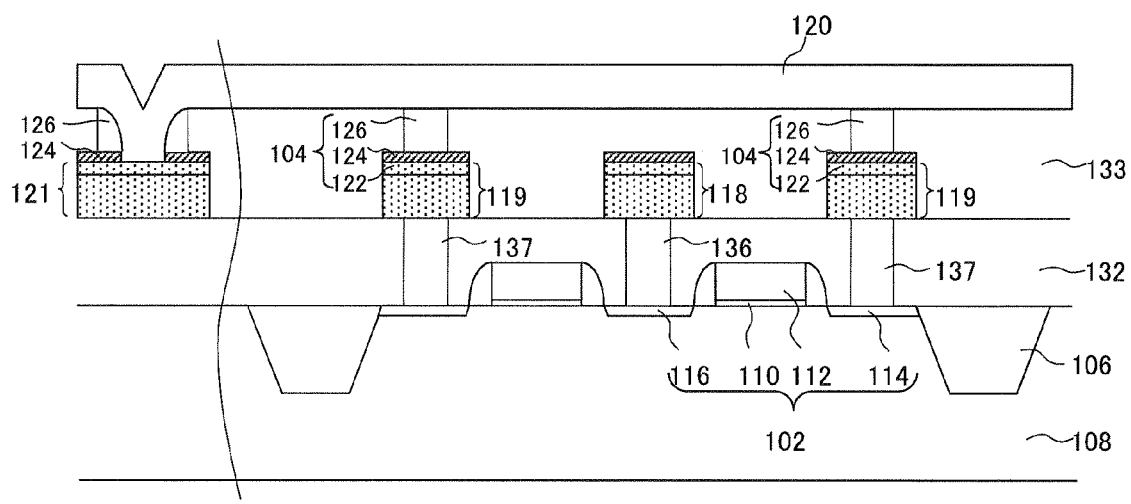
FIG. 21 is a schematic structural cross-sectional view in a production step of the nonvolatile semiconductor memory device according to the second embodiment of the present invention.
Figure 22:
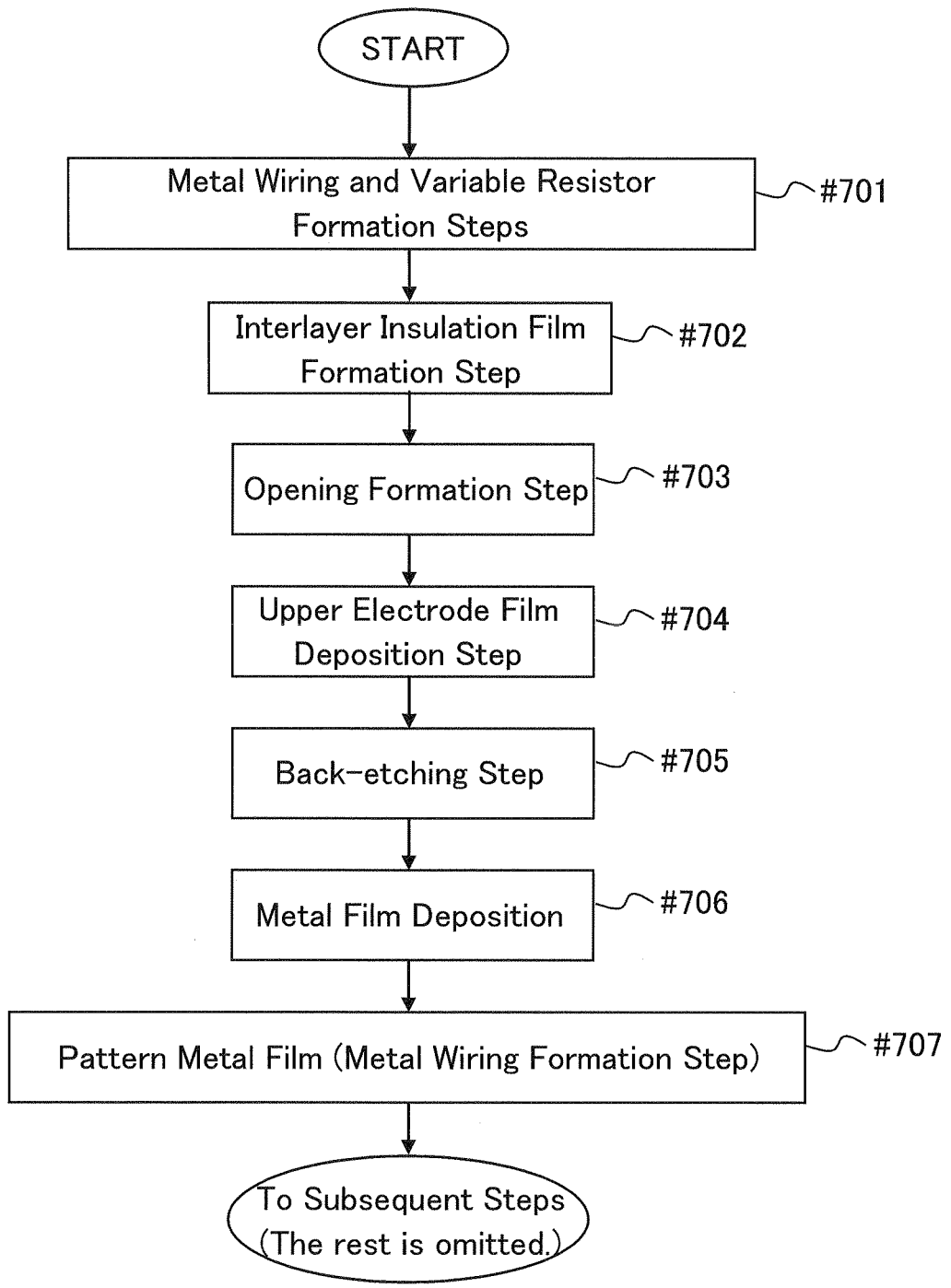
FIG. 22 is a flowchart showing the production steps of the nonvolatile semiconductor memory device according to the second embodiment of the present invention.

Then, as shown in FIG. 21, the metal film 120 having a TiN/Ti/AlCu/TiN/Ti structure is deposited to be about 300 nm in thickness on a whole surface by sputtering or the like (step #706: metal film deposition step), and then the metal film is patterned by well-known etching using a resist pattern formed by well-known photolithography as a mask, thereby forming the third metal wiring 120 which is connected to both of the first electrode 126 of the variable resistive element 104 and the second metal wiring 121 (step #707: metal wiring formation step). Thus, the memory cell array 203 is provided as shown in FIG. 15.

Then, an interlayer insulation film is deposited on a whole surface in a subsequent step. On this interlayer insulation film, an upper wiring to connect the peripheral circuits of the memory cell array 203 can be formed when it is needed. Thus, the device 100a of the present invention is produced.

Third Embodiment

Figure 23:
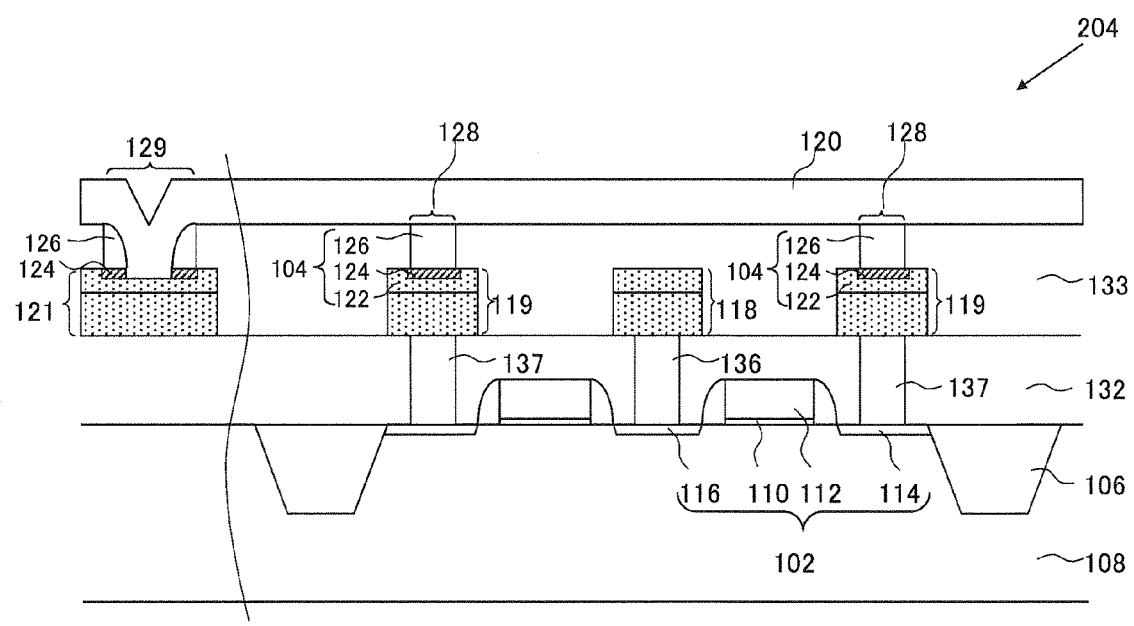
FIG. 23 is a schematic structural cross-sectional view of a memory cell array of a nonvolatile semiconductor memory device according to a third embodiment of the present invention.

Hereinafter, a description will be made of a nonvolatile semiconductor memory device according to one embodiment of the present invention (hereinafter, referred to as the "device 100b of the present invention" occasionally), and a method for producing the same (hereinafter, referred to as the "method 3 of the present invention" occasionally), with reference to the drawings. FIG. 23 is a schematic structural cross-sectional view of a memory cell array 204 in the device 100b of the present invention.

As shown in FIG. 23, similar to the memory cell array 200 in the first embodiment, the memory cell array 204 is configured by arranging variable resistive elements 104 in a row direction and a column direction in the form of a matrix, and has a 1T1R structure composed of a third metal wiring (bit line) 120 extending in the column direction, a gate electrode (word line) 112 of a transistor 102 extending in the row direction, and a source line 118 extending in the row direction.

A variable resistor 124 is formed on an uppermost layer of an island-shaped first metal wiring 119, and a first opening 128 is formed over the variable resistor 124 so as to penetrate the interlayer insulation film 133 on the variable resistor 124. Each first opening 128 is filled with a first electrode 126 in the form of a plug, and the first electrode 126 is in contact with the variable resistor 124 on a bottom of the first opening, and thus, the variable resistive element 104 is composed of the first electrode (upper electrode) 126, a second electrode (lower electrode) 122 serving as a part of the first metal wiring 119, and the variable resistor 124. The variable resistor is formed of a transition metal oxide or aluminum oxide, or transition metal oxynitride, and here, formed of a tantalum oxide ($Ta_2O_5$). As other preferable materials, an oxide or oxynitride of Ni, Co, Ti, Hf, W, Cu, Al may be used.

Meanwhile, a second opening 129 (refer to FIG. 24) having an opening area larger than that of the first opening 128 is formed over a second metal wiring 121 provided as the same layer as the first metal wiring 119. The first electrode 126 is formed on side walls of the second opening 129 and the variable resistor is left in the inner peripheral part of the bottom of the second opening 129 along the side walls. In the center of the bottom of the second opening 129, on the other hand, a contact region in which the variable resistor is not formed and the second metal wiring 121 is exposed is provided, and the second metal wiring 121 and the bit line 120 are directly connected through the contact region. Thus, the bit line 120 is connected to the second metal wiring 121 through a via hole formed in the second opening 129, whereby the memory cell array 203 is connected to a peripheral circuit such as a bit line decoder (not shown) or a read circuit (not shown).

Each bit line of the memory cell array 204 is connected to the bit line decoder, and each word line is connected to a word line decoder, whereby the device 100b of the present invention is constituted. Similar to the memory cell 200 according to the first embodiment, the memory cell array 204 can write and read data to and from a memory cell when a selection voltage is applied to a selected memory cell, and a non-selection voltage is applied to an unselected memory cell through the bit line decoder or the word line decoder.

Hereinafter, a description will be made in detail of the method for producing of the device 100b of the present invention (method 3 of the present invention) with reference to the drawings.

FIGS. 2 to 4, and FIGS. 24 to 27 are schematic structural cross-sectional views in steps to produce the device 100b of the present invention. In addition, FIG. 28 is a flowchart showing the production steps of the device 100b of the present invention. In addition, each step in the following description represents each step of the flowchart in FIG. 28.

First, similar to the first embodiment in FIG. 2, the source line 118, the first metal wiring 119, and the second metal wiring 121 are formed on the substrate on which the transistor 102 is formed, by well-known etching using a resist pattern formed by well-known photolithography as a mask (step #801: metal wiring formation step). Here, it is to be noted that in this embodiment, Ta is further deposited to be about 10 nm in film thickness by sputtering on the TiN/Ti/AlCu/TiN/Ti structure in the first embodiment, as the metal wiring layers 118, 119, and 121. A part of the Ta film having the film thickness of about 10 nm formed as an uppermost layer of the first metal wiring 119 is oxidized by an oxidation treatment step which will be described below and becomes the variable resistor 124, and the TiN film having a film thickness of about 60 nm formed just under the Ta film becomes the lower electrode (second electrode) 122 of the variable resistive element.

Then, similar to the first embodiment in FIG. 3, a $SiO_2$ film 133 serving as a second interlayer insulation film is deposited on a whole surface by plasma CVD so as to cover the first and second metal wirings, to be 200 nm in thickness on the metal wirings, for example (step #802: interlayer insulation film formation step).

Then, similar to the first embodiment in FIG. 4, using the resist pattern formed by well-known photolithography as a mask, the first opening 128 reaching the first metal wiring 119 is formed in a variable resistive element formation region in the second interlayer insulation film 133 on the first metal wiring 119, and the second opening 129 reaching the second metal wiring 121 is formed in a contact hole formation region in the second interlayer insulation film 133 on the second metal wiring 121, at the same time by well-known etching (step #803: opening formation step). Similar to the first and second embodiments, shapes and sizes of the first opening 128 and the second opening 129 are set such that the first opening 128 is completely filled with the first electrode and the second opening 129 is not completely filled with the first electrode in a step of depositing an upper electrode (first electrode) which will be described below. Here, the first opening is 200 nm in diameter, and the second opening is 600 nm in diameter.

Figure 24:
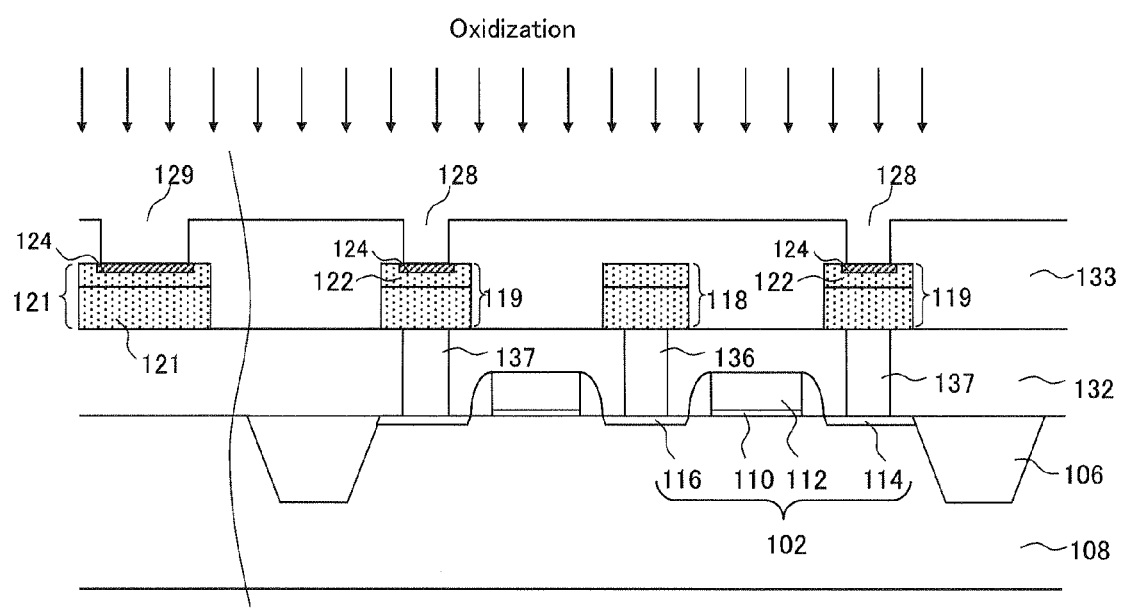
FIG. 24 is a schematic structural cross-sectional view in a production step of the nonvolatile semiconductor memory device according to the third embodiment of the present invention.

Then, as shown in FIG. 24, the Ta film serving as the uppermost layer of the first metal wiring 119 exposed at the bottom of the first opening 128 is thermally oxidized at 250 to 450° C. (400° C., here) in an atmosphere containing oxygen, whereby the $Ta_2O_5$ film 124 serving as one example of the variable resistor is formed in the bottom of the first opening 128 (step #804: oxidation process step). At this time, the Ta film serving as the uppermost layer of the second metal wiring 121 exposed at the bottom of the second opening 129 is also oxidized, whereby the $Ta_2O_5$ film 124 serving as the variable resistor is formed in the bottom of the second opening 129.

Figure 25:
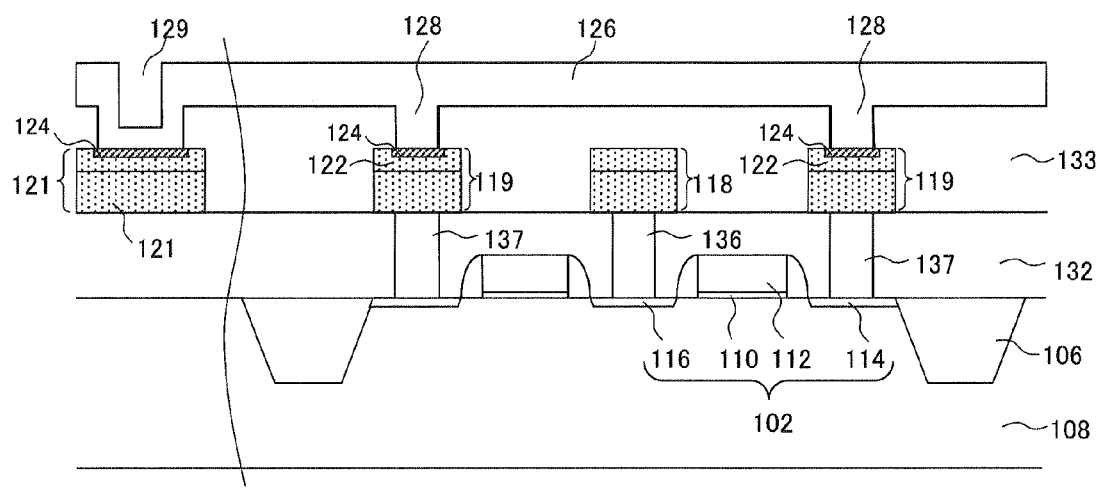
FIG. 25 is a schematic structural cross-sectional view in a production step of the nonvolatile semiconductor memory device according to the third embodiment of the present invention.

Then, as shown in FIG. 25, as one example of the upper electrode (first electrode), the film 126 having a W/TiN/Ta structure, for example is deposited on a whole surface to be 200 nm/10 nm/20 nm in thickness, for example by sputtering and CVD so as to completely fill the first opening 128, and not to completely fill and not to cover in the second opening 129 (step #805: upper electrode film deposition step).

Figure 26:
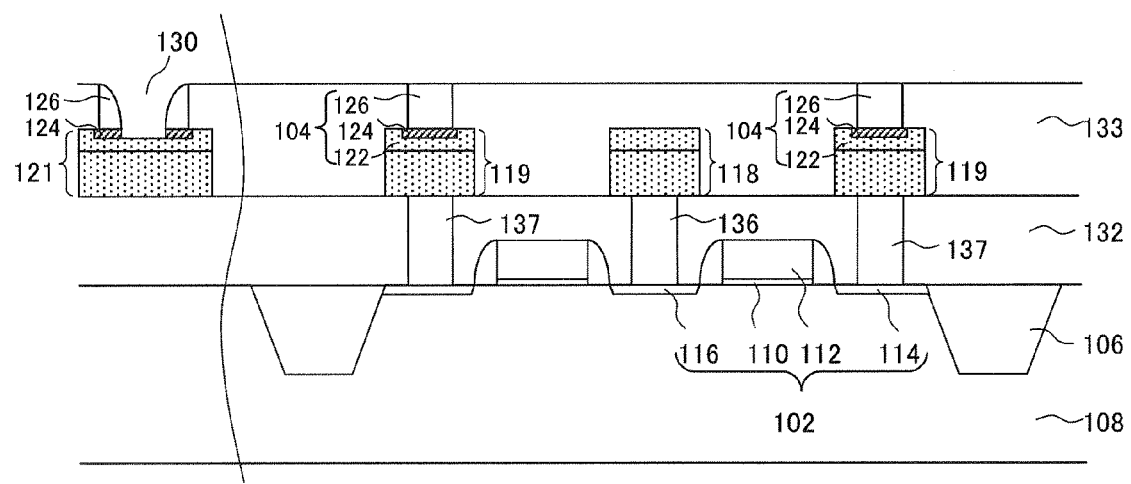
FIG. 26 is a schematic structural cross-sectional view in a production step of the nonvolatile semiconductor memory device according to the third embodiment of the present invention.

Then, as shown in FIG. 26, the first electrode 126 is back-etched until the surface of the variable resistor 124 is exposed at the bottom of the second opening 129 by dry etching using $SF_6$, for example to remove the first electrode 126 on the second interlayer insulation film 133. Furthermore, the variable resistor 124 is back-etched until the TiN film of the second metal wiring just under the variable resistor 124 is exposed at the bottom of the second opening 129, to remove the variable resistor 124 in the bottom of the second opening 129 (step #806: back-etching step). In addition, the back-etching of the first electrode 126 and the back-etching of the variable resistor 124 are sequentially performed. At this time, a back-etching time is adjusted so that the variable resistive element 104 is provided in the first opening 128 in such a manner that the first electrode 126 is left in the form of a plug, and the $Ta_2O_5$ film as the variable resistor 124 is sandwiched between the first electrode 126 and the second electrode 122.

Thus, the variable resistive element 104 is formed in the first opening 128, and a via hole 130 to connect the second metal wiring 121 and the upper metal wiring is formed in the second opening 129, at the same time.

Figure 27:
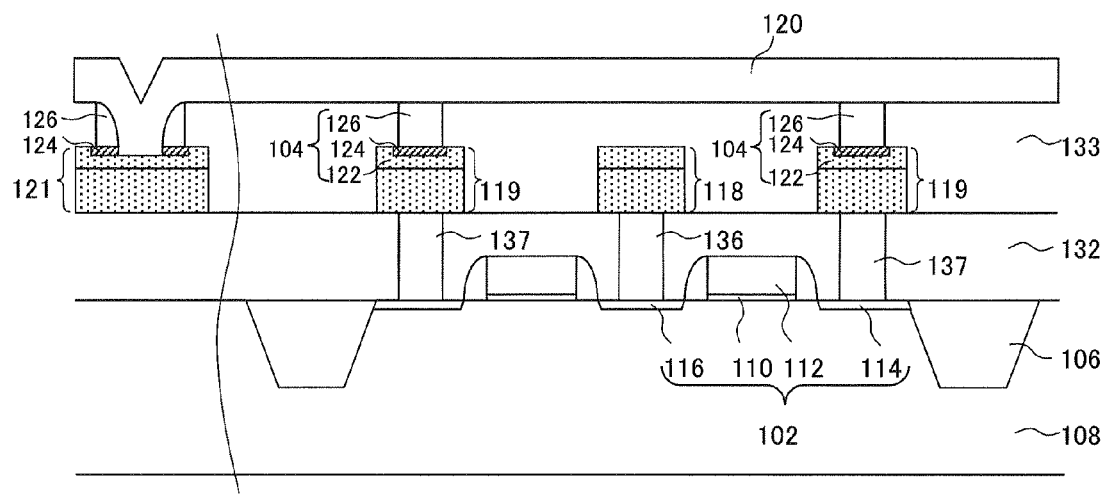
FIG. 27 is a schematic structural cross-sectional view in a production step of the nonvolatile semiconductor memory device according to the third embodiment of the present invention.
Figure 28:
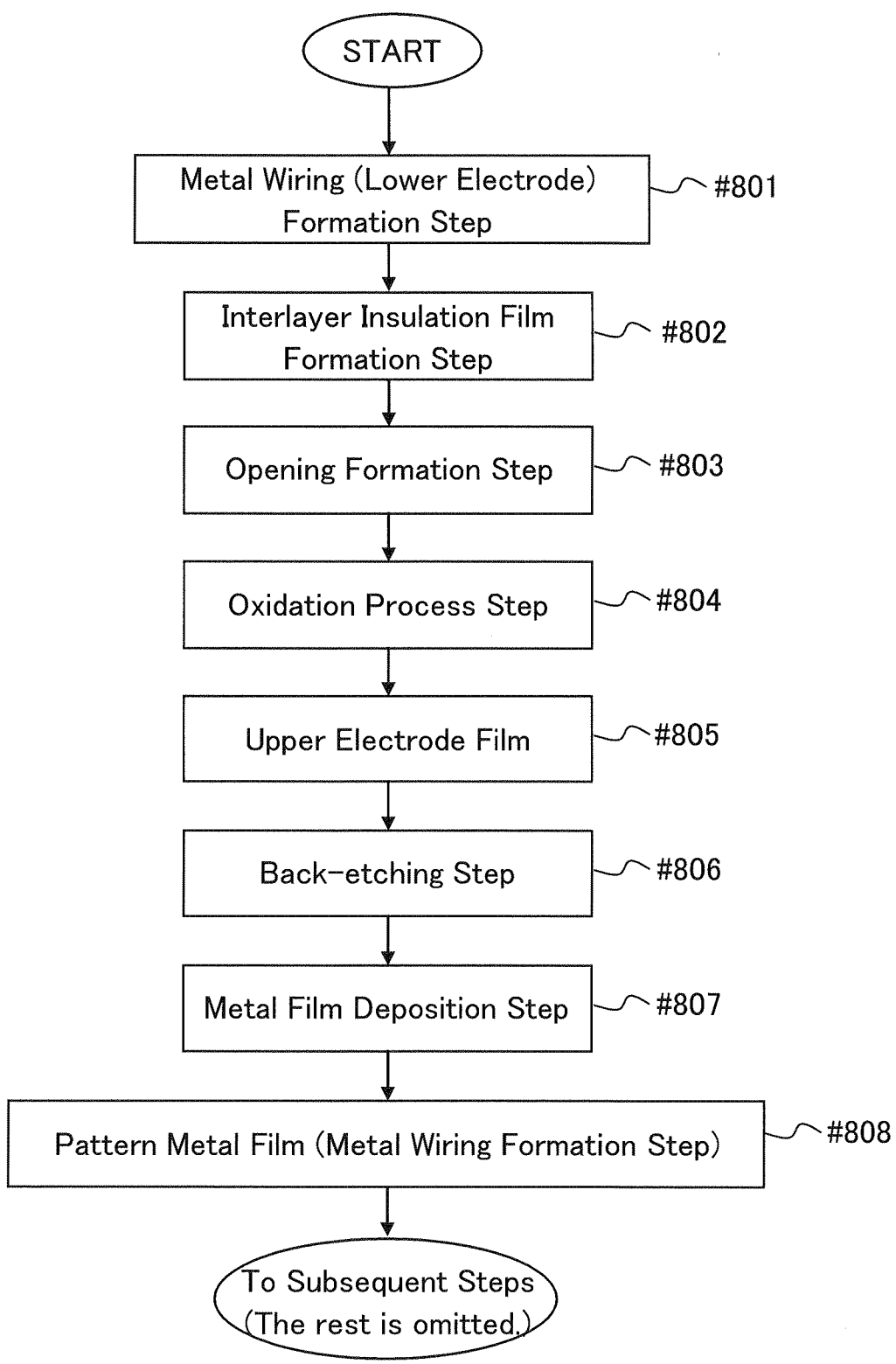
FIG. 28 is a flowchart showing the production steps of the nonvolatile semiconductor memory device according to the third embodiment of the present invention.

Then, as shown in FIG. 27, the metal film 120 having a TiN/Ti/AlCu/TiN/Ti structure is deposited to be about 300 nm in thickness on a whole surface by sputtering or the like (step #807: metal film deposition step), and then the metal film is patterned by well-known etching using a resist pattern formed by well-known photolithography as a mask, thereby forming the third metal wiring 120 which is connected to both of the first electrode 126 of the variable resistive element 104 and the second metal wiring 121 (step #808: metal wiring formation step). Thus, the memory cell array 204 is formed as shown in FIG. 23.

Then, an interlayer insulation film is deposited on a whole surface in a subsequent step. On this interlayer insulation film, an upper wiring to connect the peripheral circuits of the memory cell array 204 can be formed when it is needed. Thus, the device 100*b* of the present invention is produced.

Figure 12:
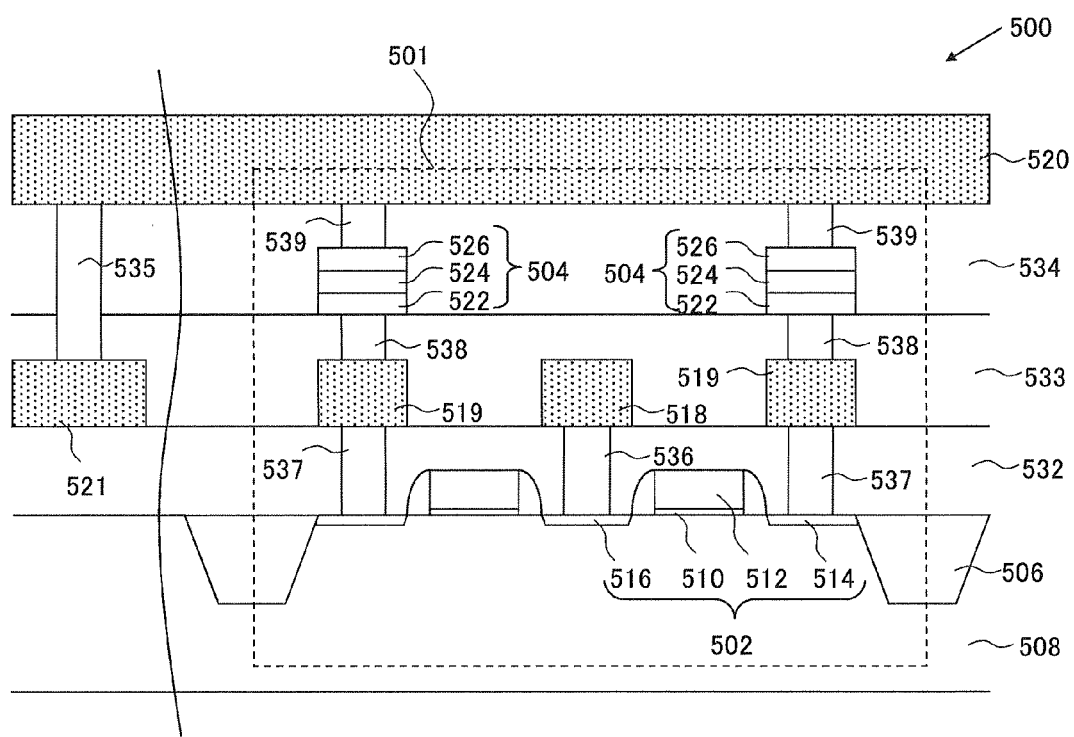
FIG. 12 is a schematic structural cross-sectional view of a memory cell array of a conventional nonvolatile semiconductor memory device.
Figure 13:
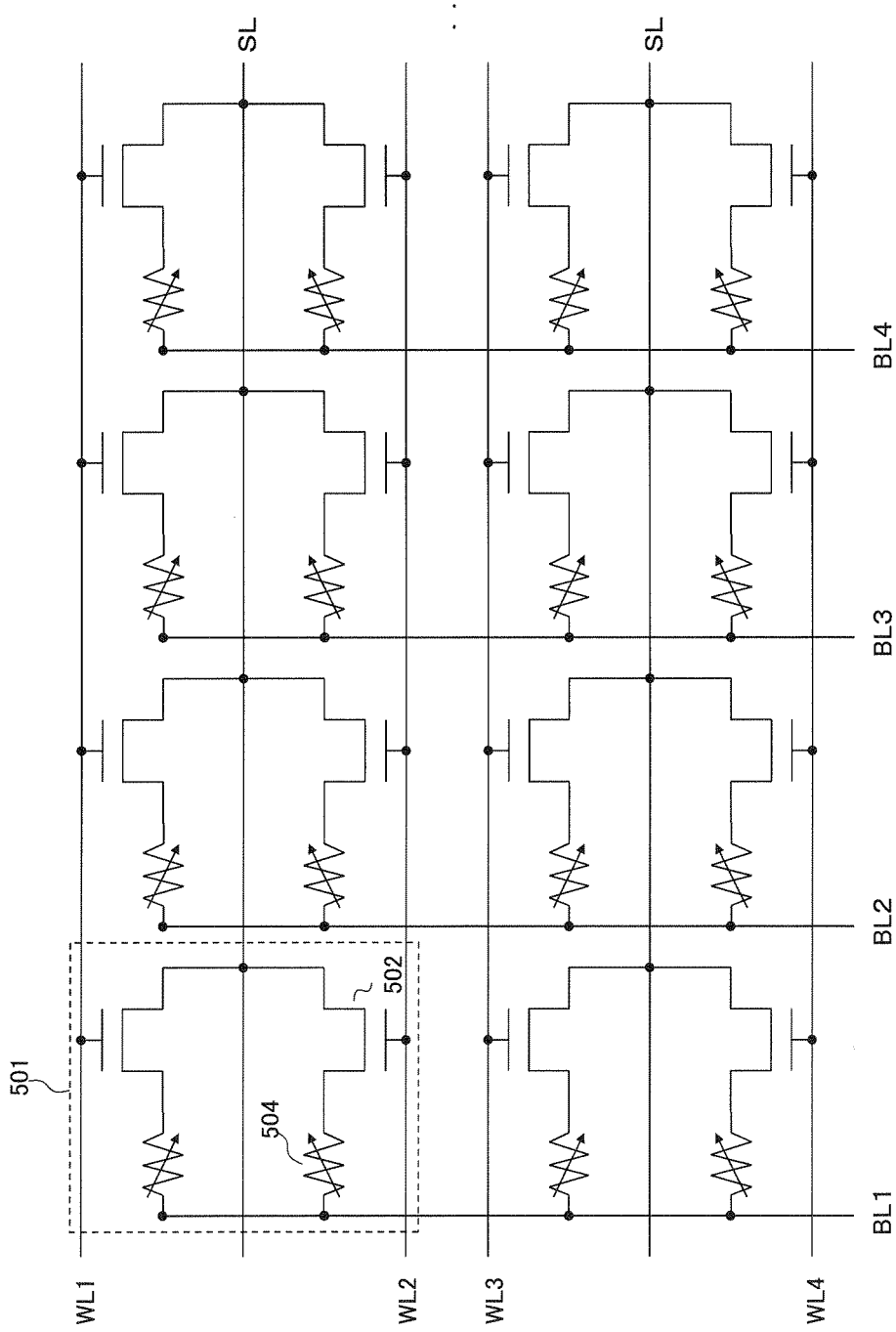
FIG. 13 is an equivalent circuit diagram of the memory cell array of the conventional nonvolatile semiconductor memory device.
Figure 14:
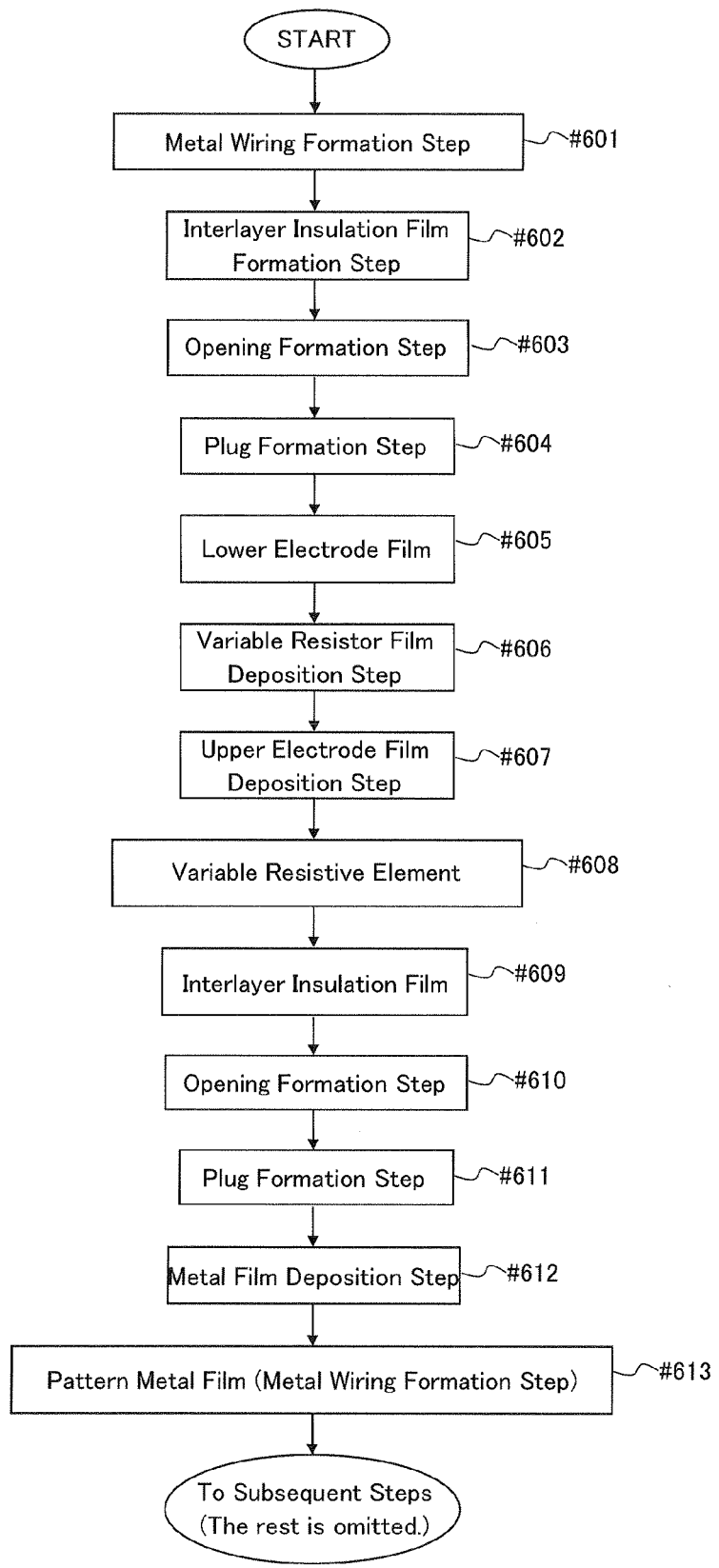
FIG. 14 is a flowchart showing production steps of the conventional nonvolatile semiconductor memory device.

According to the above methods 1 to 3 of the present invention, the variable resistive element 104 is formed in the first opening 128 on the first metal wiring 119, and the via hole to connect the second metal wiring 121 and the third metal wiring 120 is formed in the second opening 129 on the second metal wiring 121, at the same time, so that it is not necessary to separately form the contact plug 538 to connect the metal wiring 519 and the second electrode 522, the contact plug 539 to connect the metal wiring 520 and the first electrode 526, and the contact plug 535 to connect the metal wiring 520 and the metal wiring 521, as compared with the production steps of the conventional memory cell array 500 shown in FIG. 12. As a result, the nonvolatile semiconductor memory device is implemented such that the number of photomasks is reduced, the number of production steps is reduced, the cost is low, and productivity and yieldability are superior.

That is, according to any one of the methods 1 to 3 of the present invention and the devices 100, 100*a*, and 100*b* of the present invention, the variable resistive element and the via hole to connect the metal wirings can be formed at the same time by differentiating the sizes or shapes of the openings formed over the metal wirings in the interlayer insulation film, so that the nonvolatile semiconductor memory device has the structure in which the number of photomasks is reduced, the number of production steps is reduced, the cost is cut, and productivity and yieldability are superior as compared with the conventional steps.

In addition, the above embodiments are examples of preferred embodiments in the present invention, so that the embodiment of the present invention is not limited to the above, and various kinds of modifications may be made without departing from the scope of the present invention.

Hereinafter, other embodiments will be described.

Figure 29:
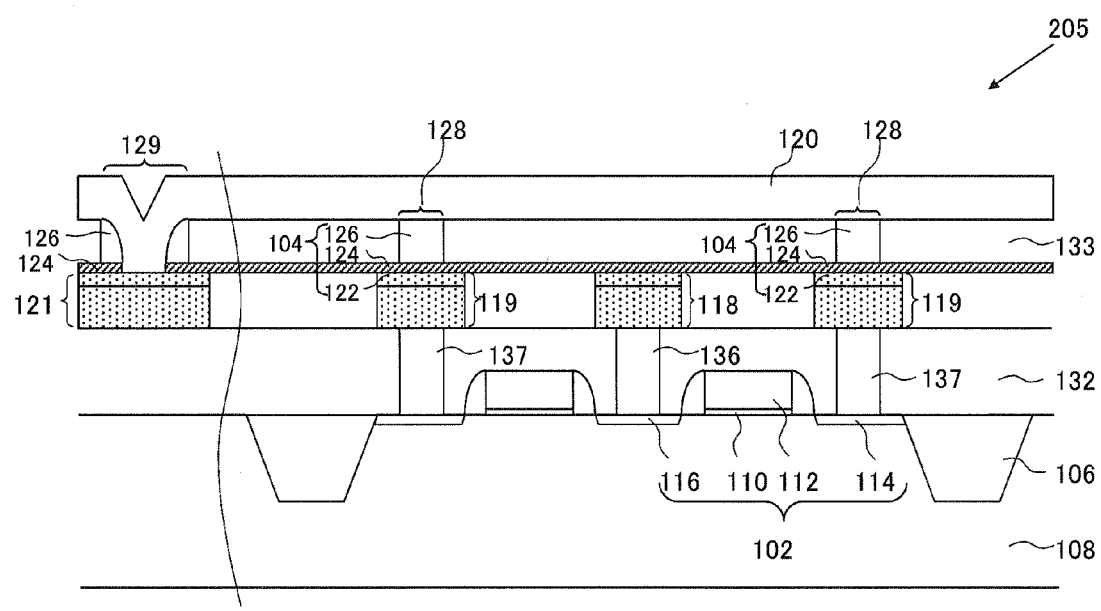
FIG. 29 is a schematic structural cross-sectional view of a memory cell array of a nonvolatile semiconductor memory device according to another embodiment of the present invention.
Figure 30:
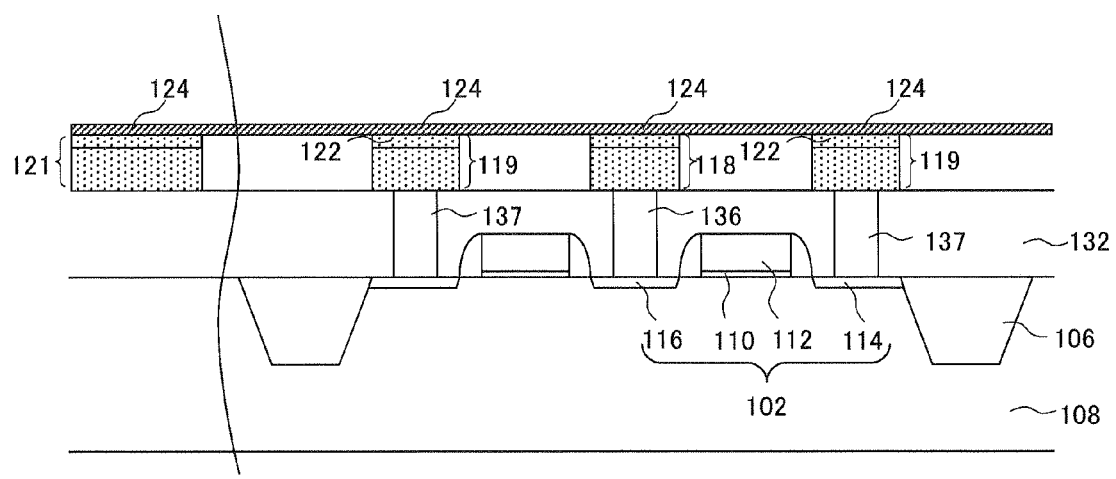
FIG. 30 is a schematic structural cross-sectional view in a production step of the nonvolatile semiconductor memory device according to the other embodiment of the present invention.
Figure 31:
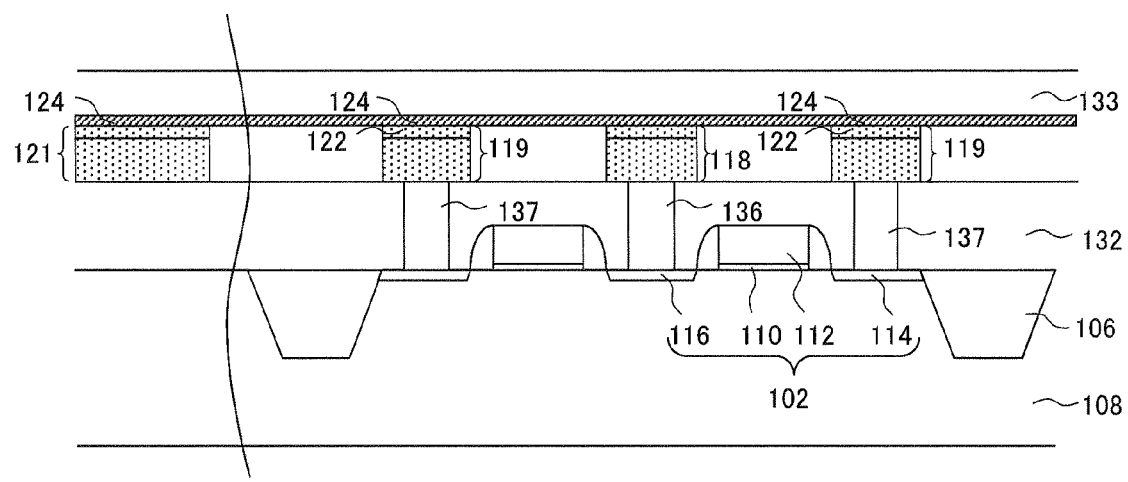
FIG. 31 is a schematic structural cross-sectional view in a production step of the nonvolatile semiconductor memory device according to the other embodiment of the present invention.
Figure 32:
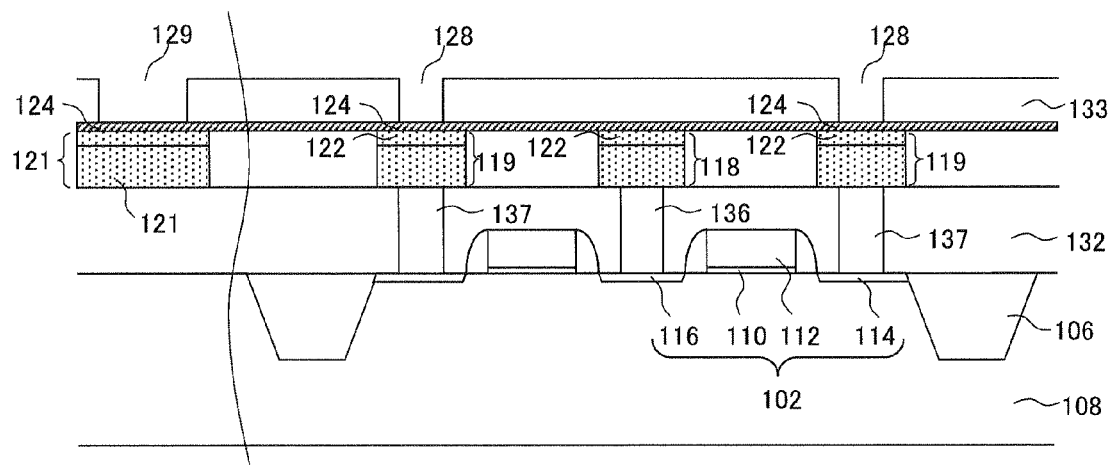
FIG. 32 is a schematic structural cross-sectional view in a production step of the nonvolatile semiconductor memory device according to the other embodiment of the present invention.
Figure 33:
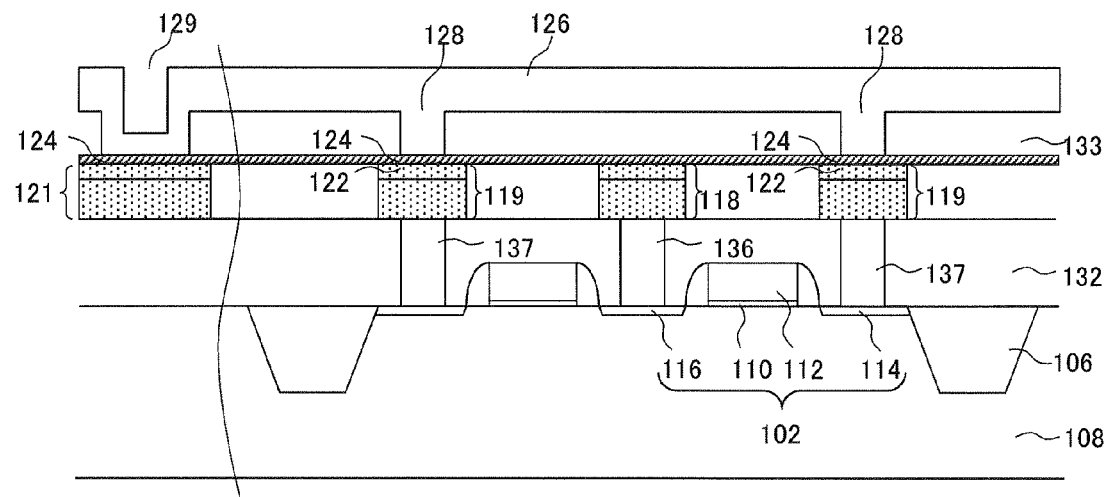
FIG. 33 is a schematic structural cross-sectional view in a production step of the nonvolatile semiconductor memory device according to the other embodiment of the present invention.
Figure 34:
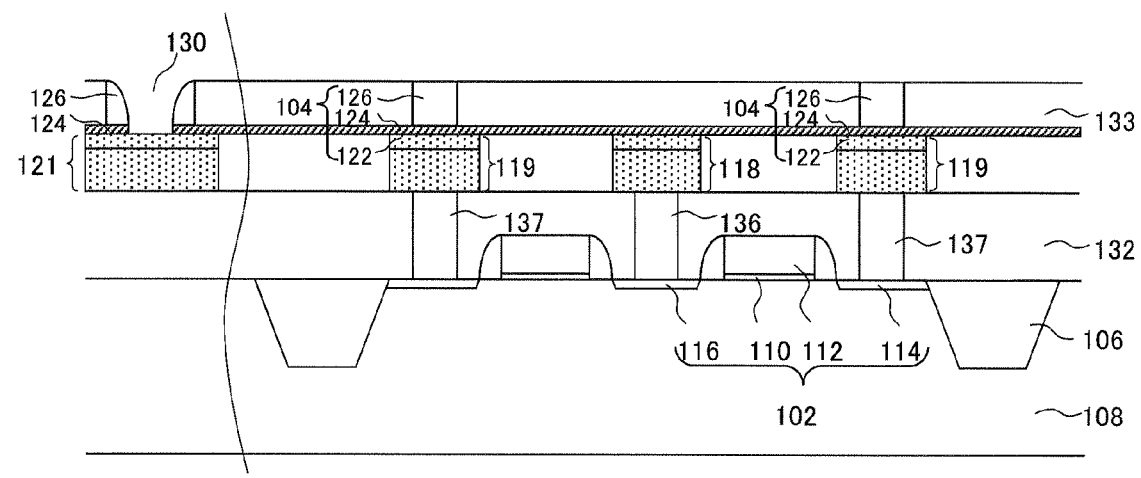
FIG. 34 is a schematic structural cross-sectional view in a production step of the nonvolatile semiconductor memory device according to the other embodiment of the present invention.
Figure 35:
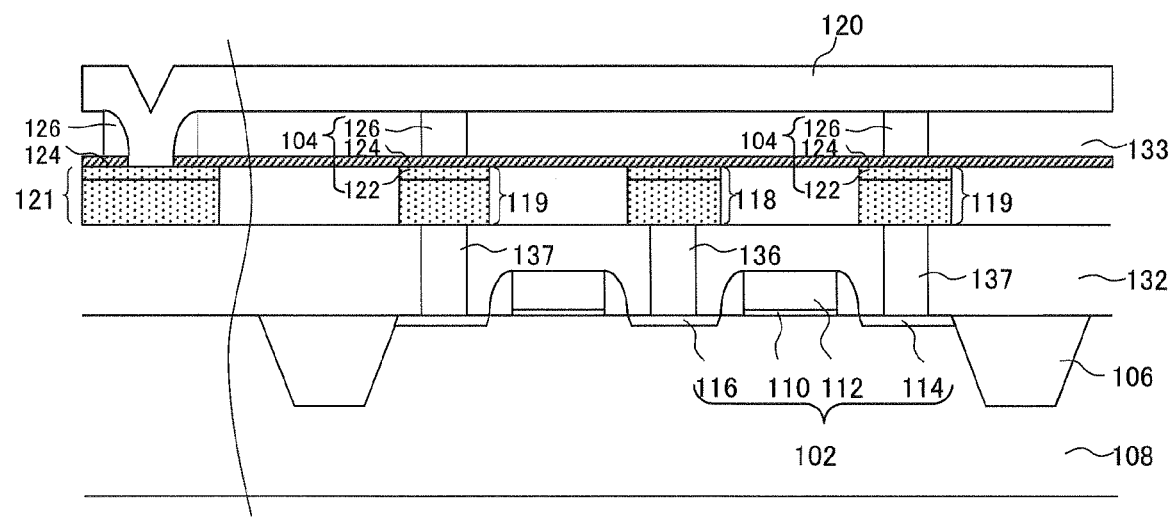
FIG. 35 is a schematic structural cross-sectional view in a production step of the nonvolatile semiconductor memory device according to the other embodiment of the present invention.

(1) According to the production method of the device 100*a* of the present invention according to the second embodiment, after the variable resistor 124 has been deposited on the metal film having the TiN/Ti/AlCu/TiN/Ti structure, the source line 118, the first metal wiring 119, and the second metal wiring 121 and the variable resistor 124 are formed by etching at the same time, but the variable resistor may be deposited on the whole surface after the first metal wiring 119 and the second metal wiring 121 have been formed by etching. FIG. 29 is a structural cross-sectional view of a memory cell array 205 which employs the above production method. In addition, FIGS. 30 to 35 are schematic structural cross-sectional views in steps of producing the memory cell array 205 by the above production method. The production steps shown in FIGS. 30 to 35 correspond to FIGS. 16 to 21 showing the production steps by the method 2 of the present invention described in the second embodiment, respectively. When a state of a variable resistor 124 after the film has been formed is an insulator, when a predetermined voltage pulse is applied between a first electrode 126 and a second electrode 122, that is, and what is called forming process is performed, resistance is lowered only in the variable resistor 124 provided in a first opening bottom and sandwiched between the first electrode 126 and the second electrode 122, so that a variable resistive element can be used to shift the current-voltage characteristics between the first electrode 126 and the second electrode 122 to two or more different states. Therefore, even when the variable resistor 124 is deposited on the whole surface, the operation of the memory cell array is not affected by that.

Figure 10:
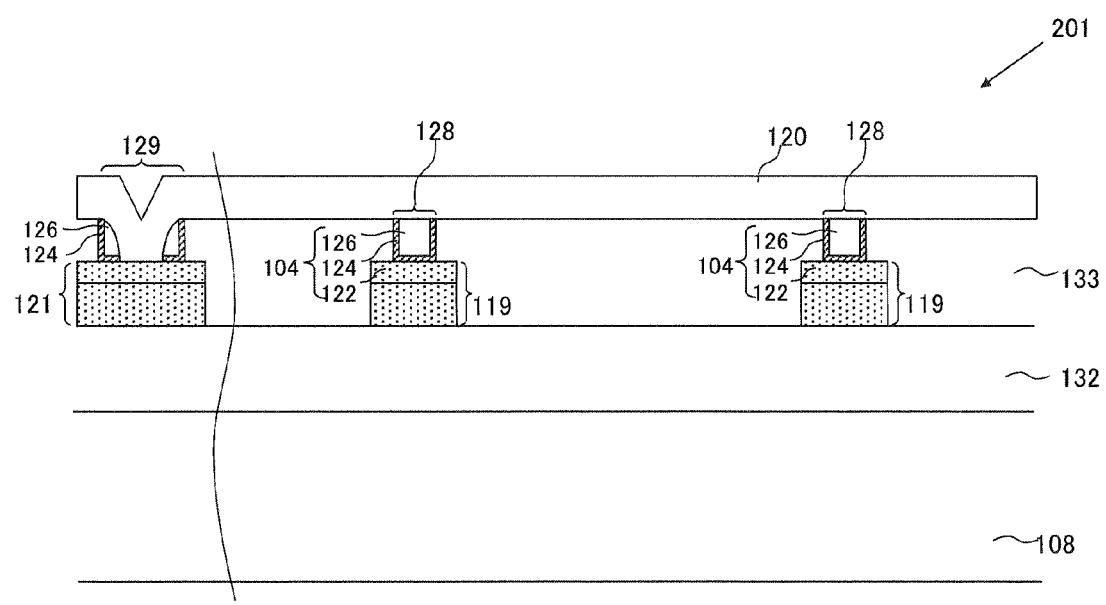
FIG. 10 is a schematic structural cross-sectional view of a memory cell array of a nonvolatile semiconductor memory device according to another embodiment of the present invention.

(2) While the configuration of the present invention has been described using the memory cell array 200 having the 1T1R structure in which the selection transistor is formed on the substrate and the variable resistive element is formed thereon, in the above embodiments, the present invention is not limited to this configuration. FIG. 10 is a structural cross-sectional view of a memory cell array 201 when the method 1 of the present invention is applied to the production of a memory cell array having a 1R structure. A first metal wiring 119 and a second metal wiring 121 are formed on an insulation film 132, and first openings 128 (refer to FIG. 4) are arranged in each row direction (vertical direction with respect to a sheet surface), and each column direction (horizontal direction with respect to the drawing) on the first metal wiring 119 so as to be in the form of a matrix. Thus, first electrodes 126 of variable resistive elements belonging to the same column are connected to each other by a third metal wiring 120 serving as a bit line extending in the column direction, and second electrodes 122 of the variable resistive elements belonging to the same row are connected to each other by the first metal wiring 119 extending in the row direction, whereby the memory cell array is constituted. Furthermore, the third metal wiring 120 serving as the bit line is connected to the second metal wiring 121 through a via hole formed in a second opening 129 (refer to FIG. 4).

Figure 36:
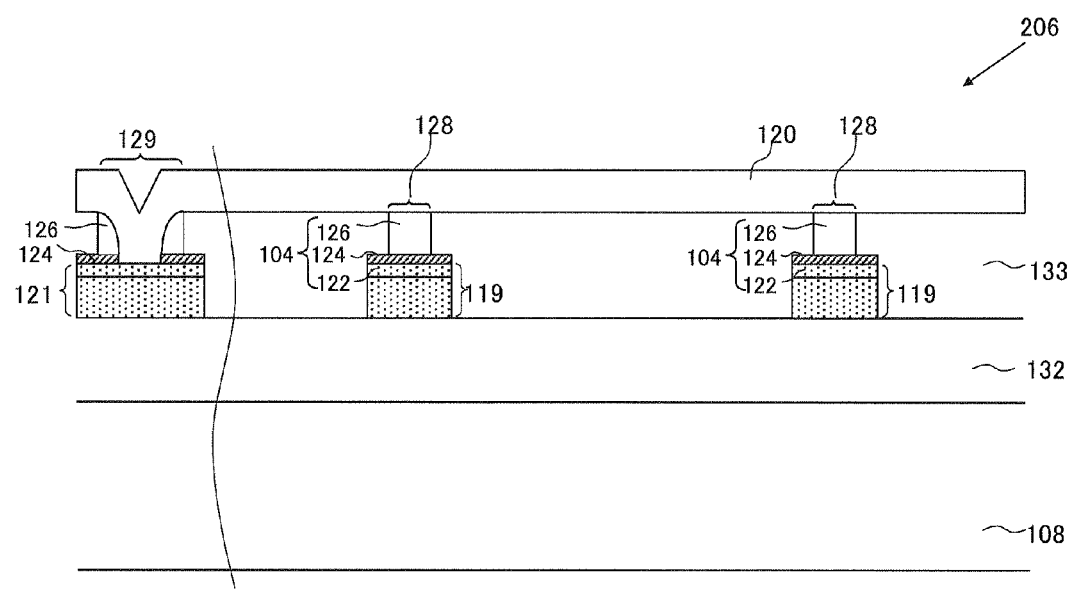
FIG. 36 is a schematic structural cross-sectional view of a memory cell array of a nonvolatile semiconductor memory device according to another embodiment of the present invention.
Figure 37:
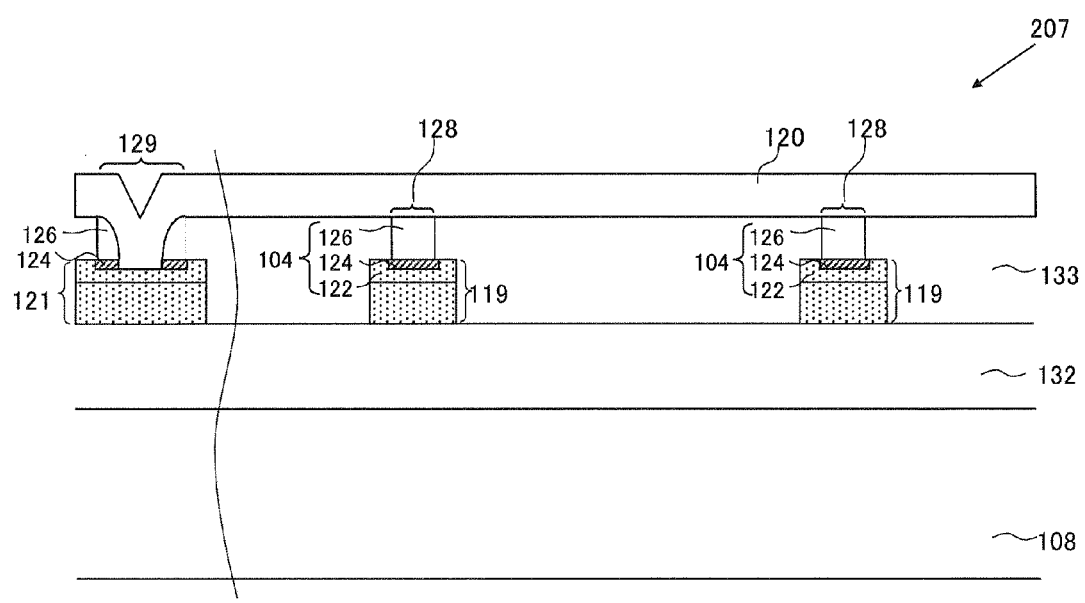
FIG. 37 is a schematic structural cross-sectional view of a memory cell array of a nonvolatile semiconductor memory device according to another embodiment of the present invention.

Similarly, FIG. 36 shows a structural cross-sectional view of a memory cell array 206 when the method 2 of the present invention is applied to the production of the memory cell array having the 1R structure, and FIG. 37 shows a structural cross-sectional view of a memory cell array 207 when the method 3 of the present invention is applied to the production of the memory cell array having the 1R structure.

Similarly, the method of the present invention can produce a nonvolatile semiconductor memory device having a memory cell array of a 1D1R structure having a diode or nonlinear element as a selection element to be connected to the first metal wiring 119.

(3) In addition, in the step of depositing the variable resistor film in the above embodiment, a film thickness of the variable resistor can be controlled by using an appropriate deposition technique such as directional sputtering such as collimated sputtering, long throw sputtering, or ionization sputtering, or CVD method, or ALD method.

(4) In addition, while the tantalum oxide ($Ta_2O_5$) is used for the variable resistor in the above, a transition metal oxide such as $NiO$, $CoO_2$, $TiO_2$, or $HfO_2$, aluminum oxide, or transition metal oxynitride may be used.

(5) Furthermore, while the base substrate is the semiconductor substrate in the above embodiment, a glass substrate or plastic substrate may be used. In addition, while the transistor serving as the selection element is MOS transistor in the above, a bipolar transistor or a thin film transistor (TFT) may be used. In this configuration, the nonvolatile semiconductor memory device can be formed on a substrate for a liquid crystal display.

Figure 11:
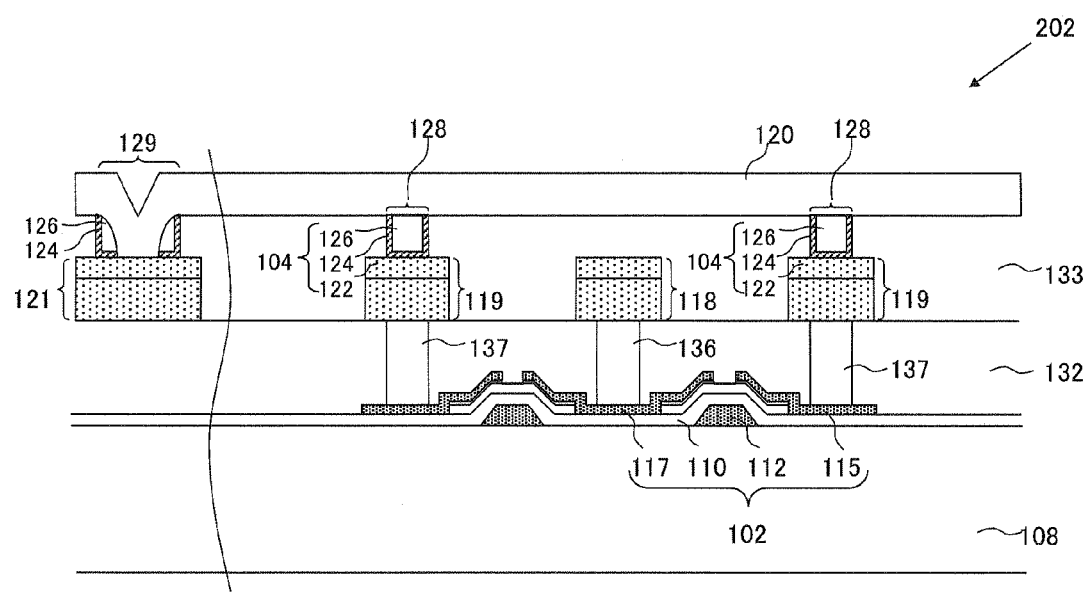
FIG. 11 is a schematic structural cross-sectional view of a memory cell array of a nonvolatile semiconductor memory device according to another embodiment of the present invention.

FIG. 11 shows a configuration using the thin film transistor as the selection element in the device 100 of the present invention, in which a thin film transistor 102 is composed of a gate insulation film 110, a gate electrode 112, a drain electrode 115, and a source electrode 117 and formed on an upper surface of a glass substrate 108, and the drain electrode 115 of the thin film transistor 102 is connected to the variable resistive element 104 through a contact plug 137 and a first metal wiring 119, whereby a memory cell array 202 is formed.

Figure 38:
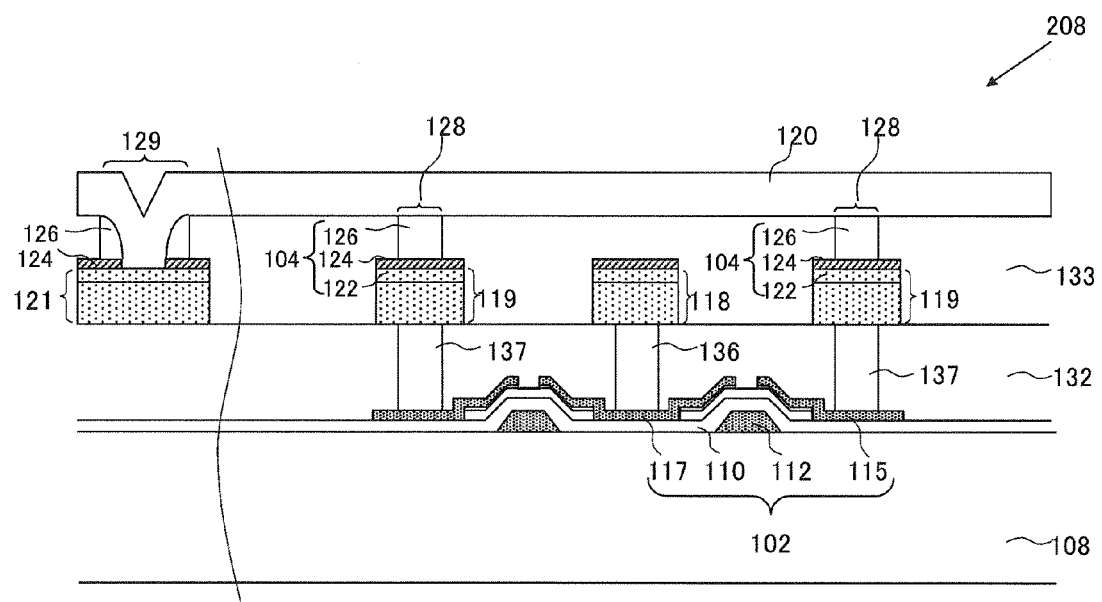
FIG. 38 is a schematic structural cross-sectional view of a memory cell array of a nonvolatile semiconductor memory device according to another embodiment of the present invention.
Figure 39:
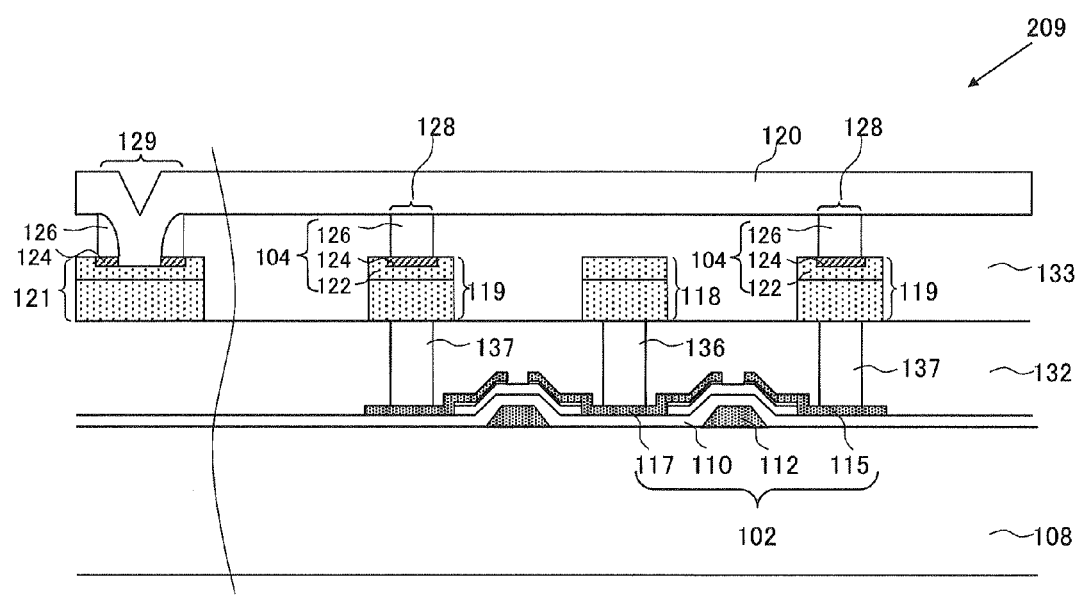
FIG. 39 is a schematic structural cross-sectional view of a memory cell array of a nonvolatile semiconductor memory device according to another embodiment of the present invention.

Similarly, FIG. 38 shows a memory cell array 208 using the thin film transistor as the selection element in the device 100a of the present invention, and FIG. 39 shows a memory cell array 209 using the thin film transistor as the selection element in the device 100b of the present invention.

The present invention can be applied to the nonvolatile semiconductor memory device, and especially applied to the nonvolatile semiconductor memory device having the variable resistive element in which a resistance state is shifted by a voltage application and its shifted resistance state is maintained in a nonvolatile manner.

Although the present invention has been described in terms of a preferred embodiment, it will be appreciated that various modifications and alterations might be made by those skilled in the art without departing from the invention. The invention should therefore be measured in terms of the claims which follow.

What is claimed is:

1. A method for producing a nonvolatile semiconductor memory device comprising:
    forming a first metal wiring and a second metal wiring on a substrate;
    forming an interlayer insulation film on a whole surface to cover the first metal wiring and the second metal wiring;
    forming a first opening having a depth to reach the first metal wiring, in the interlayer insulation film on the first metal wiring, and forming a second opening having a depth to reach the second metal wiring, in the interlayer insulation film on the second metal wiring;
    depositing a variable resistor on a whole surface so as not to completely fill the first opening and the second opening, and so as not to cover in the first opening and the second opening,
    depositing a first electrode on a whole surface so as to completely fill the first opening but not to completely fill and not to cover in the second opening;
    back-etching the first electrode both in the first opening and in the second opening simultaneously, until a surface of the variable resistor is exposed in the second opening, with the first opening filled with the first electrode;
    back-etching the variable resistor both in the first opening and in the second opening simultaneously, until a surface of the second metal wiring is exposed in the second opening, with the first opening filled with the first electrode;
    forming a third metal wiring on the second metal wiring exposed in the second opening, and on the first electrode formed in the first opening; and
    wherein at least one of a shape or a size of the first opening is different from that of the second opening.

2. The method for producing the nonvolatile semiconductor memory device according to claim 1, wherein an opening area of the second opening is formed to be larger than an opening area of the first opening, in the step of forming the first opening and the second opening.

3. The method for producing the nonvolatile semiconductor memory device according to claim 1, further comprising forming a selection element connected to the first metal wiring.

4. The method for producing the nonvolatile semiconductor memory device according to claim 3, wherein the selection element is a transistor.

5. The method for producing the nonvolatile semiconductor memory device according to claim 4, wherein the selection element is a thin film transistor.

6. The method for producing the nonvolatile semiconductor memory device according to claim 1, wherein the variable resistor is formed of a transition metal oxide or an aluminum oxide or an aluminum oxynitride, or a transition metal oxynitride.

7. The method for producing the nonvolatile semiconductor memory device according to claim 6, wherein the variable resistor is formed of an oxide or an oxynitride containing one element selected from at least Ni, Co, Ti, Ta, Hf, W, Cu, and Al.

* * * * *